United States Patent
Chung et al.

(10) Patent No.: US 8,347,170 B2
(45) Date of Patent: Jan. 1, 2013

(54) METHOD AND APPARATUS FOR PERFORMING DECODING USING LDPC CODE

(75) Inventors: Ji Wook Chung, Anyang-si (KR); Suk Woo Lee, Anyang-si (KR); Min Seok Oh, Anyang-si (KR)

(73) Assignee: LG Electronics Inc., Seoul (KR)

( * ) Notice: Subject to any disclaimer, the term of this patent is extended or adjusted under 35 U.S.C. 154(b) by 246 days.

(21) Appl. No.: 12/919,417

(22) PCT Filed: Mar. 2, 2009

(86) PCT No.: PCT/KR2009/000998
§ 371 (c)(1),
(2), (4) Date: Aug. 25, 2010

(87) PCT Pub. No.: WO2009/108025
PCT Pub. Date: Sep. 3, 2009

(65) Prior Publication Data
US 2011/0010602 A1      Jan. 13, 2011

(30) Foreign Application Priority Data

Feb. 28, 2008    (KR) .................. 10-2008-0018116

(51) Int. Cl.
*H03M 13/00* (2006.01)
(52) U.S. Cl. ...................... 714/752; 714/758

(58) Field of Classification Search .................. 714/752, 714/758
See application file for complete search history.

(56) References Cited

U.S. PATENT DOCUMENTS

2006/0129904 A1   6/2006  Blankenship et al.
2009/0259915 A1*  10/2009 Livshitz et al. ............... 714/758

FOREIGN PATENT DOCUMENTS

| KR | 10-2006-0012110 A | 2/2006 |
| KR | 10-2006-0071856 A | 6/2006 |
| WO | WO 2006/065286 A1 | 6/2006 |
| WO | WO 2007/045961 A1 | 4/2007 |

OTHER PUBLICATIONS

Mohsenin et al., "Split-Row: A Reduced Complexity, High Throughput LDPC Decoder Architecture," International Conference on Computer Design, pp. 320-325, Oct. 1-4, 2007.
Oh et al., "Row-Splitting Design of Low-Density Parity-Check Codes for Gbps transmission," IEEE VTC-2007 Fall, pp. 1127-1131, Sep. 30-Oct. 3, 2007.

* cited by examiner

*Primary Examiner* — Sam Rizk
(74) *Attorney, Agent, or Firm* — Birch, Stewart, Kolasch & Birch

(57) ABSTRACT

A method of performing decoding using an LDPC code is disclosed. The method of performing decoding an encoded codeword using a parity check matrix, comprises decoding the codeword using the parity check matrix, wherein the parity check matrix includes a plurality of layers, each of which includes at least one or more rows split exclusively from a specific row of a base parity check matrix.

6 Claims, 30 Drawing Sheets

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

FIG. 4

FIG. 5A
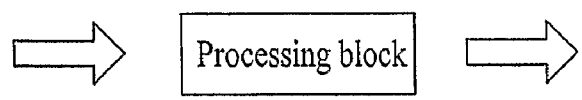
In case of serial processing
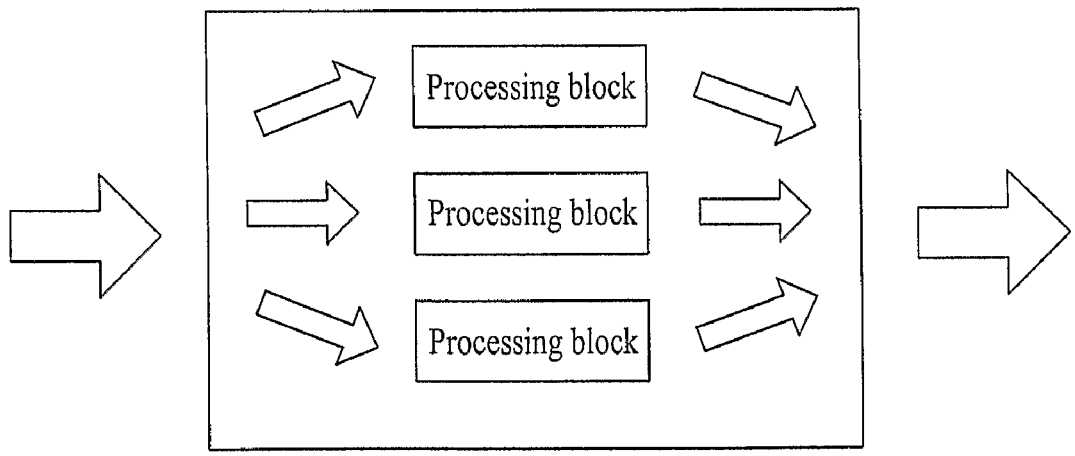
In case of parallel processing FIG. 5B
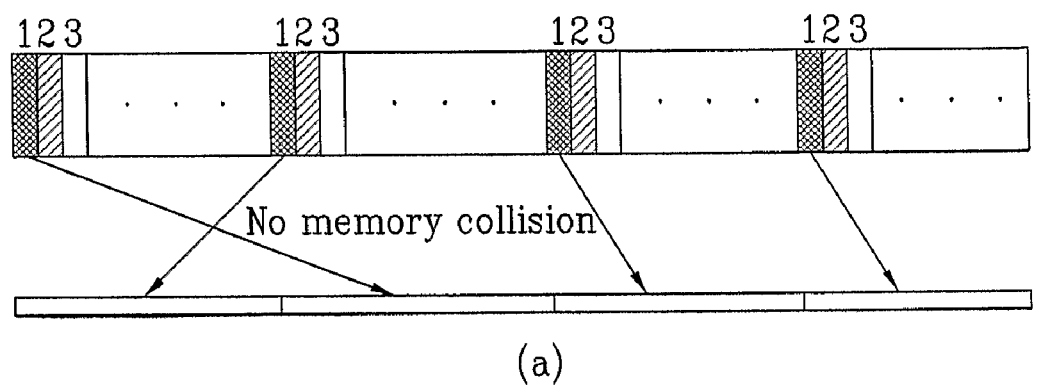
(a)
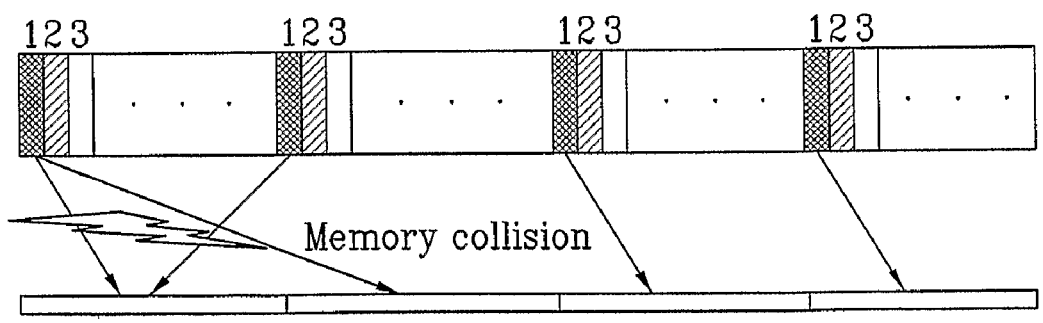

FIG. 6

$$\begin{bmatrix}
-1 & -1 & -1 & 2 & -1 & -1 & 12 & 70 & -1 & -1 & 24 & -1 & 95 & 0 & -1 & -1 & -1 & -1 & -1 & -1 & -1 & -1 & -1 \\
-1 & -1 & -1 & -1 & 91 & 32 & -1 & -1 & -1 & 79 & 56 & -1 & -1 & 0 & 0 & -1 & -1 & -1 & -1 & -1 & -1 & -1 & -1 \\
-1 & -1 & -1 & 11 & -1 & 79 & 10 & -1 & -1 & -1 & -1 & 36 & -1 & -1 & 0 & 0 & -1 & -1 & -1 & -1 & -1 & -1 & -1 \\
-1 & -1 & -1 & 59 & 16 & -1 & 77 & -1 & -1 & -1 & -1 & 78 & 0 & -1 & -1 & 0 & 0 & -1 & -1 & -1 & -1 & -1 & -1 \\
-1 & -1 & 18 & -1 & -1 & -1 & 64 & 91 & -1 & -1 & 3 & -1 & -1 & -1 & -1 & -1 & 0 & 0 & -1 & -1 & -1 & -1 & -1 \\
-1 & 73 & 47 & -1 & -1 & 53 & -1 & -1 & -1 & -1 & -1 & 41 & -1 & -1 & -1 & -1 & -1 & 0 & 0 & -1 & -1 & -1 & -1 \\
72 & 34 & -1 & -1 & -1 & -1 & -1 & -1 & 6 & -1 & -1 & 54 & -1 & -1 & -1 & -1 & -1 & -1 & 0 & 0 & -1 & -1 & -1 \\
56 & 10 & 40 & -1 & -1 & -1 & -1 & -1 & 29 & -1 & -1 & -1 & -1 & -1 & -1 & -1 & -1 & -1 & -1 & 0 & 0 & -1 & -1 \\
-1 & -1 & 64 & -1 & -1 & -1 & -1 & 12 & -1 & 84 & 56 & -1 & -1 & -1 & -1 & -1 & -1 & -1 & -1 & -1 & 0 & 0 & -1 \\
67 & 53 & -1 & -1 & -1 & 26 & -1 & -1 & 19 & -1 & -1 & -1 & -1 & -1 & -1 & -1 & -1 & -1 & -1 & -1 & -1 & 0 & 0 \\
-1 & -1 & -1 & 0 & 48 & -1 & -1 & -1 & 84 & 16 & -1 & -1 & -1 & -1 & -1 & -1 & -1 & -1 & -1 & -1 & -1 & -1 & 0 \\
7 & -1 & -1 & -1 & 76 & -1 & -1 & 25 & -1 & 35 & -1 & -1 & 95 & -1 & -1 & -1 & -1 & -1 & -1 & -1 & -1 & -1 & 0
\end{bmatrix}$$

FIG. 7

$$\begin{bmatrix}
23 & 68 & -1 & -1 & -1 & -1 & -1 & -1 & 7 & -1 & -1 & 10 & 95 & 0 & -1 & -1 & -1 & -1 & -1 & -1 & -1 & -1 & -1 \\
41 & 62 & 27 & -1 & -1 & -1 & -1 & -1 & 13 & -1 & -1 & -1 & -1 & 0 & 0 & -1 & -1 & -1 & -1 & -1 & -1 & -1 & -1 \\
-1 & -1 & 0 & -1 & -1 & -1 & -1 & 12 & -1 & 30 & 3 & -1 & -1 & -1 & 0 & 0 & -1 & -1 & -1 & -1 & -1 & -1 & -1 \\
88 & 50 & -1 & -1 & -1 & 77 & -1 & -1 & 34 & -1 & -1 & -1 & -1 & -1 & -1 & 0 & 0 & -1 & -1 & -1 & -1 & -1 & -1 \\
-1 & -1 & -1 & 38 & 21 & -1 & -1 & -1 & 46 & 85 & -1 & -1 & -1 & -1 & -1 & -1 & 0 & 0 & -1 & -1 & -1 & -1 & -1 \\
35 & -1 & -1 & -1 & 11 & -1 & -1 & 1 & -1 & 27 & -1 & -1 & -1 & -1 & -1 & -1 & -1 & 0 & 0 & -1 & -1 & -1 & -1 \\
-1 & -1 & -1 & 16 & -1 & -1 & 86 & 89 & -1 & -1 & 39 & -1 & -1 & -1 & -1 & -1 & -1 & -1 & 0 & 0 & -1 & -1 & -1 \\
-1 & -1 & -1 & -1 & 25 & 44 & -1 & -1 & -1 & 76 & 57 & -1 & 0 & -1 & -1 & -1 & -1 & -1 & -1 & 0 & 0 & -1 & -1 \\
-1 & -1 & -1 & 78 & -1 & 3 & 70 & -1 & -1 & -1 & -1 & 31 & -1 & -1 & -1 & -1 & -1 & -1 & -1 & -1 & 0 & 0 & -1 \\
-1 & -1 & -1 & 70 & 40 & -1 & 89 & -1 & -1 & -1 & -1 & 86 & -1 & -1 & -1 & -1 & -1 & -1 & -1 & -1 & -1 & 0 & 0 & -1 \\
-1 & -1 & 90 & -1 & -1 & -1 & 24 & 74 & -1 & -1 & 82 & -1 & -1 & -1 & -1 & -1 & -1 & -1 & -1 & -1 & -1 & -1 & 0 & 0 \\
-1 & 38 & 24 & -1 & -1 & 30 & -1 & -1 & -1 & -1 & -1 & 20 & 95 & -1 & -1 & -1 & -1 & -1 & -1 & -1 & -1 & -1 & 0
\end{bmatrix}$$

FIG. 8A

| 1 | 25 | 55 | -1 | 47 | 4 | -1 | 91 | 84 | 8 | 86 | 52 | 82 | 33 | 5 | 0 | 36 | 20 | 4 | 77 | 80 | 0 | -1 | -1 |
|---|---|---|---|---|---|---|---|---|---|---|---|---|---|---|---|---|---|---|---|---|---|---|---|
| -1 | 6 | -1 | 36 | 40 | 47 | 12 | 79 | 47 | -1 | 41 | 21 | 12 | 71 | 14 | 72 | 0 | 44 | 49 | 0 | 0 | 0 | 0 | -1 |
| 51 | 81 | 83 | 4 | 67 | -1 | 21 | -1 | 31 | 24 | 91 | 61 | 81 | 9 | 86 | 78 | 60 | 88 | 67 | 15 | -1 | -1 | 0 | 0 |
| 68 | -1 | 50 | 15 | -1 | 36 | 13 | 10 | 11 | 20 | 53 | 90 | 29 | 92 | 57 | 30 | 84 | 92 | 11 | 66 | 80 | -1 | -1 | 0 |

| 1 | -1 | 55 | -1 | -1 | -1 | -1 | 84 | -1 | -1 | -1 | 86 | -1 | -1 | 82 | -1 | -1 | 36 | -1 | -1 | 80 | -1 | -1 | -1 | -1 | -1 | -1 | -1 | -1 | -1 | -1 | 0 | -1 | -1 | -1 | -1 |
|---|----|----|----|----|----|----|----|----|----|----|----|----|----|----|----|----|----|----|----|----|----|----|----|----|----|----|----|----|----|----|---|----|----|----|----|
| -1 | -1 | -1 | -1 | 4 | -1 | -1 | 91 | -1 | -1 | -1 | -1 | -1 | 5 | -1 | -1 | -1 | 4 | -1 | -1 | -1 | -1 | -1 | -1 | -1 | -1 | -1 | -1 | -1 | -1 | -1 | 0 | -1 | -1 | -1 | -1 |
| 1 | 25 | -1 | -1 | -1 | -1 | -1 | -1 | -1 | -1 | 52 | -1 | -1 | -1 | -1 | 0 | -1 | -1 | 77 | -1 | -1 | -1 | -1 | -1 | 0 | -1 | -1 | -1 | -1 | -1 | -1 | -1 | 0 | -1 | -1 | -1 |
| -1 | -1 | -1 | 47 | -1 | -1 | -1 | 8 | -1 | -1 | -1 | -1 | -1 | 33 | -1 | -1 | -1 | 20 | -1 | -1 | 0 | -1 | -1 | -1 | -1 | -1 | -1 | -1 | -1 | -1 | -1 | -1 | -1 | 0 | -1 | -1 |

$$Q = \begin{matrix} Layer0 \\ Layer3 \\ Layer6 \\ Layer1 \\ Layer4 \\ Layer7 \\ Layer2 \\ Layer5 \end{matrix} \begin{bmatrix} 10.54 & 0 & 4.43 & 0 & 9.00 & 0 & 6.86 & 0 & 7.75 & 0 & 8.99 & 0 & 5.21 & 0 & 5.30 & 0 & 6.54 & 9.67 & 0 & 0 & 0 & 0 & 0 & 0 \\ 0 & 8.85 & 0 & 3.76 & 0 & 11.37 & 0 & 8.34 & 0 & 4.43 & 0 & 8.02 & 0 & 10.45 & 0 & 7.03 & 0 & 0 & 9.08 & 7.32 & 8.23 & 0 & 6.67 & 10.31 \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & 0 & 0 & 0 & 0 \\ 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & 0 & 0 & 0 \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & \#\#\# & 0 & 0 & 0 & 3.93 & 0 & 0 \\ 0 & \#\#\# & 0 & \#\#\# & 0 & \#\#\# & 0 & \#\#\# & 0 & \#\#\# & 0 & \#\#\# & 0 & \#\#\# & 0 & \#\#\# & \#\#\# & 0 & \#\#\# & 0 & 0 & 0 & 0 & 0 \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & 0 & \#\#\# & 0 & \#\#\# & 0 & \#\#\# \\ 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & 0 & 0 & \#\#\# & \#\#\# & 0 \end{bmatrix}$$

FIG. 13B $$R = \begin{matrix} Layer0 \\ Layer3 \\ Layer6 \\ Layer1 \\ Layer4 \\ Layer7 \\ Layer2 \\ Layer5 \end{matrix} \begin{bmatrix} 3.67 & 0 & 4.29 & 0 & 3.67 & 0 & 3.70 & 0 & 3.68 & 0 & 3.67 & 0 & 3.29 & 0 & 3.90 & 0 & 3.28 & 0 & 3.88 & 0 & 3.30 & 0 & 3.72 & 3.67 & 0 & 0 & 0 & 0 & 0 & 0 \\ 0 & 3.28 & 0 & 4.24 & 0 & 3.28 & 0 & 3.28 & 0 & 3.66 & 0 & 3.67 & 0 & 3.29 & 0 & 3.28 & 0 & 3.28 & 0 & 3.28 & 0 & 3.28 & 0 & 0 & 3.29 & 3.28 & 0 & 0 & 0 & 0 \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & 0 & \#\#\# & 0 & \#\#\# \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & \#\#\# & 0 & 0 & 0 & 0 \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & \#\#\# & 0 & 0 & 0 \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & \#\#\# & 0 \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & 0 & \#\#\# & 0 & 0 \\ 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & 0 & 0 & \#\#\# & 0 \end{bmatrix}$$

FIG. 13C $$Q = \begin{bmatrix} 14.21 & 0 & 8.72 & 0 & 12.67 & 0 & 14.65 & 0 & 10.57 & 0 & 11.62 & 0 & 11.43 & 0 & 8.09 & 0 & 12.66 & 0 & 11.31 & 0 & 9.11 & 0 & 13.73 & 0 & 9.18 & 0 & 10.33 & 0 & 10.26 & 13.34 & 0 & 0 & 0 & 0 & 0 & 0 \\ 0 & 12.13 & 0 & 8.00 & 0 & 14.65 & 0 & 10.57 & 0 & 11.62 & 0 & 11.43 & 0 & 8.09 & 0 & 12.66 & 0 & 11.31 & 0 & 9.11 & 0 & 13.73 & 0 & 9.18 & 0 & 10.33 & 0 & 10.26 & 0 & 13.34 & 9.08 & 10.61 & 11.51 & 0 & 6.67 & 10.31 \\ 14.21 & 0 & 8.72 & 0 & 12.67 & 0 & 14.65 & 0 & 10.57 & 0 & 11.62 & 0 & 11.43 & 0 & 8.09 & 0 & 12.66 & 0 & 11.31 & 0 & 9.11 & 0 & 13.73 & 0 & 9.18 & 0 & 10.33 & 0 & 10.26 & 0 & 0 & 0 & 0 & 0 & 0 & 0 \\ 0 & 12.13 & 0 & 8.00 & 0 & 14.65 & 0 & 10.57 & 0 & 11.62 & 0 & 11.43 & 0 & 8.09 & 0 & 12.66 & 0 & 11.31 & 0 & 9.11 & 0 & 13.73 & 0 & 9.18 & 0 & 10.33 & 0 & 13.34 & 0 & 9.08 & 0 & 0 & 0 & 3.93 & 0 & 0 \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & \#\#\# & 0 & 0 & 0 & 0 \\ 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & 0 & \#\#\# & 0 & 0 & 0 \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & \#\#\# & 0 & 0 & 0 & 0 & 0 \\ 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & \#\#\# & \#\#\# & 0 & \#\#\# & 0 \end{bmatrix}$$

Layer0, Layer3, Layer6, Layer1, Layer4, Layer7, Layer2, Layer5

FIG. 13D

| | | | | | | | | | | | | | | | | | | | | | | | |
|---|---|---|---|---|---|---|---|---|---|---|---|---|---|---|---|---|---|---|---|---|---|---|---|
| Layer0 | 3.67 | 0 | 4.29 | 0 | 3.67 | 0 | 3.70 | 0 | 3.68 | 0 | 3.67 | 0 | 3.90 | 0 | 3.88 | 0 | 3.72 | 3.67 | 0 | 0 | 0 | 0 | 0 |
| Layer3 | 0 | 3.28 | 0 | 4.24 | 0 | 3.28 | 0 | 3.28 | 0 | 3.66 | 0 | 3.29 | 0 | 3.28 | 0 | 3.30 | 0 | 0 | 3.29 | 3.28 | 0 | 0 | 0 |
| Layer6 | 6.34 | 0 | 6.44 | 0 | 6.35 | 0 | 6.36 | 0 | 6.35 | 0 | 6.35 | 0 | 6.41 | 0 | 6.40 | 0 | 6.36 | 0 | 0 | 0 | 0 | 7.62 | 6.36 |
| Layer1 | 0 | 7.11 | 0 | 7.64 | 0 | 7.11 | 0 | 7.12 | 0 | 7.58 | 0 | 7.12 | 0 | 7.11 | 0 | 7.15 | 0 | 7.11 | 0 | 0 | 7.26 | 0 | 0 |
| R= Layer4 | ### | 0 | ### | 0 | ### | 0 | ### | 0 | ### | 0 | ### | 0 | ### | 0 | ### | 0 | ### | 0 | 0 | ### | 0 | 0 | 0 |
| Layer7 | 0 | ### | 0 | ### | 0 | ### | 0 | ### | 0 | ### | 0 | ### | 0 | ### | 0 | ### | 0 | 0 | ### | 0 | 0 | 0 | ### |
| Layer2 | ### | 0 | ### | 0 | ### | 0 | ### | 0 | ### | 0 | ### | 0 | ### | 0 | ### | 0 | ### | 0 | 0 | 0 | ### | 0 | 0 |
| Layer5 | 0 | ### | 0 | ### | 0 | ### | 0 | ### | 0 | ### | 0 | ### | 0 | ### | 0 | ### | 0 | ### | 0 | 0 | 0 | ### | 0 |

FIG. 13E $Q =$

| | | | | | | | | | | | | | | | | | | | | | | | |
|---|---|---|---|---|---|---|---|---|---|---|---|---|---|---|---|---|---|---|---|---|---|---|---|
| Layer0 | 14.21 | 0 | 8.72 | 0 | 12.67 | 0 | 10.57 | 0 | 11.43 | 0 | 12.66 | 0 | 9.11 | 0 | 13.73 | 0 | 9.18 | 0 | 10.33 | 0 | 10.26 | 13.34 | 0 | 0 | 0 | 0 | 0 |
| Layer3 | 0 | 12.13 | 0 | 8.00 | 0 | 14.65 | 0 | 11.62 | 0 | 8.09 | 0 | 11.31 | 0 | 13.73 | 0 | 10.33 | 0 | 10.61 | 11.51 | 0 | 0 | 14.29 | 0 | 16.67 |
| Layer6 | 20.55 | 0 | 15.16 | 0 | 19.02 | 0 | 16.93 | 0 | 17.78 | 0 | 19.01 | 0 | 15.52 | 0 | 15.58 | 0 | 16.63 | 0 | 0 | 0 | 0 | 0 | 0 | 0 |
| Layer1 | 0 | 19.24 | 0 | 15.64 | 0 | 21.76 | 0 | 18.74 | 0 | 15.67 | 0 | 18.43 | 0 | 20.84 | 0 | 17.48 | 0 | 20.45 | 16.34 | 0 | 0 | 0 | 0 | 0 |
| Layer4 | 20.55 | 0 | 15.16 | 0 | 19.02 | 0 | 16.93 | 0 | 17.78 | 0 | 19.01 | 0 | 15.52 | 0 | 15.58 | 0 | 16.63 | 0 | 0 | 11.51 | 0 | 0 | 0 | 16.67 |
| Layer7 | 0 | 19.24 | 0 | 15.64 | 0 | 21.76 | 0 | 18.74 | 0 | 15.67 | 0 | 18.43 | 0 | 20.84 | 0 | 17.48 | 0 | 0 | 0 | 0 | 0 | 0 | 0 | 0 |
| Layer2 | ### | 0 | ### | 0 | ### | 0 | ### | 0 | ### | 0 | ### | 0 | ### | 0 | ### | 0 | ### | 0 | ### | 0 | ### | 0 | ### | 0 |
| Layer5 | 0 | ### | 0 | ### | 0 | ### | 0 | ### | 0 | ### | 0 | ### | 0 | ### | 0 | ### | 0 | ### | 0 | 3.93 | 0 | 0 | ### | 0 |

FIG. 13F

$$R = \begin{matrix} Layer0 \\ Layer3 \\ Layer6 \\ Layer1 \\ Layer4 \\ Layer7 \\ Layer2 \\ Layer5 \end{matrix} \begin{bmatrix} 3.67 & 0 & 4.29 & 0 & 3.67 & 0 & 3.70 & 0 & 3.68 & 0 & 3.67 & 0 & 3.90 & 0 & 3.88 & 0 & 3.72 & 3.67 & 0 & 0 & 0 & 0 & 0 & 0 \\ 0 & 3.28 & 0 & 4.24 & 0 & 3.28 & 0 & 3.28 & 0 & 3.66 & 0 & 3.29 & 0 & 3.28 & 0 & 3.30 & 0 & 0 & 7.26 & 0 & 3.29 & 3.28 & 0 & 0 \\ 6.34 & 0 & 6.44 & 0 & 6.35 & 0 & 6.36 & 0 & 6.35 & 0 & 6.41 & 0 & 6.40 & 0 & 6.36 & 0 & 0 & 0 & 0 & 0 & 0 & 7.62 & 6.36 \\ 0 & 7.11 & 0 & 7.64 & 0 & 7.11 & 0 & 7.12 & 0 & 7.58 & 0 & 7.12 & 0 & 7.11 & 0 & 7.15 & 0 & 7.11 & 0 & 0 & 0 & 0 & 0 & 0 \\ 3.93 & 0 & 3.93 & 0 & 3.93 & 0 & 3.93 & 0 & 3.93 & 0 & 3.93 & 0 & 3.93 & 0 & 3.93 & 0 & 0 & 0 & 0 & 0 & 3.93 & 11.44 & 0 & 14.67 \\ 0 & 14.55 & 0 & 14.95 & 0 & 14.54 & 0 & 14.56 & 0 & 14.93 & 0 & 14.56 & 0 & 14.54 & 0 & 14.60 & 14.67 & 0 & 0 & 0 & 0 & 0 & 0 & 0 \\ \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & 0 & \#\#\# & 0 & 0 & \#\#\# & 0 \\ 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & 0 & 0 & 0 & \#\#\# & 0 \end{bmatrix}$$

FIG. 13G $$Q = \begin{bmatrix}
14.21 & 0 & 8.72 & 0 & 12.67 & 0 & 10.57 & 0 & 11.43 & 0 & 11.62 & 0 & 12.66 & 0 & 9.11 & 0 & 9.18 & 0 & 10.26 & 13.34 & 0 & 0 & 0 & 0 & 0 & 0 \\
0 & 12.13 & 0 & 8.00 & 0 & 14.65 & 0 & 11.62 & 0 & 8.09 & 0 & 11.31 & 0 & 13.73 & 0 & 10.33 & 0 & 16.63 & 0 & 0 & 10.61 & 11.51 & 0 & 0 & 14.29 & 16.67 \\
20.55 & 0 & 15.16 & 0 & 19.02 & 0 & 16.93 & 0 & 17.78 & 0 & 19.01 & 0 & 15.52 & 0 & 15.58 & 0 & 17.48 & 0 & 20.45 & 16.34 & 0 & 0 & 0 & 0 & 0 & 0 \\
0 & 19.24 & 0 & 15.64 & 0 & 21.76 & 0 & 18.74 & 0 & 15.67 & 0 & 18.43 & 0 & 20.84 & 0 & 19.51 & 0 & 0 & 0 & 0 & 0 & 0 & 15.44 & 15.37 & 0 & 0 \\
24.48 & 0 & 19.09 & 0 & 22.95 & 0 & 20.86 & 0 & 21.71 & 0 & 22.94 & 0 & 19.45 & 0 & 19.51 & 0 & 32.08 & 31.30 & 0 & 0 & 0 & 0 & 0 & 0 & 0 & 31.34 \\
0 & 33.79 & 0 & 30.59 & 0 & 36.30 & 0 & 33.30 & 0 & 30.60 & 0 & 32.99 & 0 & 35.38 & 0 & 19.51 & 0 & 0 & 0 & 0 & 0 & 0 & 0 & 0 & 0 & 0 \\
24.48 & 0 & 19.09 & 0 & 22.95 & 0 & 20.86 & 0 & 21.71 & 0 & 22.94 & 0 & 19.45 & 0 & 19.51 & 0 & 32.08 & 0 & 16.34 & 10.61 & 0 & 0 & 0 & 0 & 0 & 0 \\
0 & 33.79 & 0 & 30.59 & 0 & 36.30 & 0 & 33.30 & 0 & 30.60 & 0 & 32.99 & 0 & 35.38 & 0 & 32.08 & 0 & 0 & 0 & 0 & 0 & 0 & 15.37 & 14.29 & 0 & 0
\end{bmatrix}$$

Layer0, Layer3, Layer6, Layer1, Layer4, Layer7, Layer2, Layer5

FIG. 13H $$R = \begin{bmatrix} 3.67 & 0 & 4.29 & 0 & 3.67 & 0 & 3.70 & 0 & 3.68 & 0 & 3.67 & 0 & 3.90 & 0 & 3.88 & 0 & 3.30 & 0 & 3.72 & 3.67 & 0 & 0 & 0 & 0 & 0 & 0 \\ 0 & 3.28 & 0 & 4.24 & 0 & 3.28 & 0 & 3.28 & 0 & 3.66 & 0 & 3.29 & 0 & 3.28 & 0 & 0 & 0 & 0 & 0 & 3.29 & 3.28 & 0 & 0 & 0 \\ 6.34 & 0 & 6.44 & 0 & 6.35 & 0 & 6.36 & 0 & 6.35 & 0 & 6.35 & 0 & 6.41 & 0 & 6.40 & 0 & 0 & 0 & 6.36 & 0 & 0 & 0 & 0 & 0 \\ 0 & 7.11 & 0 & 7.64 & 0 & 7.11 & 0 & 7.12 & 0 & 7.58 & 0 & 7.12 & 0 & 7.11 & 0 & 7.15 & 0 & 7.11 & 7.26 & 0 & 0 & 0 & 7.62 & 0 \\ 3.92 & 0 & 3.92 & 0 & 3.92 & 0 & 3.92 & 0 & 3.92 & 0 & 3.92 & 0 & 3.92 & 0 & 3.92 & 0 & 0 & 0 & 0 & 0 & 3.93 & 0 & 0 & 6.36 \\ 0 & 14.55 & 0 & 14.95 & 0 & 14.54 & 0 & 14.56 & 0 & 14.93 & 0 & 14.56 & 0 & 14.54 & 0 & 14.60 & 14.67 & 0 & 0 & 0 & 0 & 14.67 & 0 & 0 \\ 7.16 & 0 & 7.16 & 0 & 7.16 & 0 & 7.16 & 0 & 7.16 & 0 & 7.16 & 0 & 7.16 & 0 & 7.16 & 0 & 0 & 0 & 0 & 7.32 & 9.08 & 0 & 0 & 0 \\ 0 & 14.00 & 0 & 14.00 & 0 & 14.00 & 0 & 14.00 & 0 & 14.00 & 0 & 14.00 & 0 & 14.00 & 0 & 14.00 & 0 & 0 & 0 & 0 & 0 & 14.29 & 15.37 & 0 \end{bmatrix}$$

(Rows labeled: Layer0, Layer3, Layer6, Layer1, Layer4, Layer7, Layer2, Layer5)

FIG. 13I $$Q = \begin{bmatrix}
\text{Layer0} & 14.21 & 0 & 8.72 & 0 & 12.67 & 0 & 10.57 & 0 & 11.43 & 0 & 12.66 & 0 & 9.11 & 0 & 9.18 & 0 & 10.26 & 13.34 & 0 & 0 & 0 & 0 & 0 \\
\text{Layer3} & 0 & 12.13 & 0 & 8.00 & 0 & 14.65 & 0 & 11.62 & 0 & 8.09 & 0 & 11.31 & 0 & 13.73 & 0 & 10.33 & 0 & 0 & 10.61 & 11.51 & 0 & 0 & 0 \\
\text{Layer6} & 20.55 & 0 & 15.16 & 0 & 19.02 & 0 & 16.93 & 0 & 17.78 & 0 & 19.01 & 0 & 15.52 & 0 & 15.58 & 0 & 16.63 & 0 & 0 & 0 & 0 & 14.29 & 16.67 \\
\text{Layer1} & 0 & 19.24 & 0 & 15.64 & 0 & 21.76 & 0 & 18.74 & 0 & 15.67 & 0 & 18.43 & 0 & 20.84 & 0 & 17.48 & 0 & 20.45 & 16.34 & 0 & 0 & 0 & 0 \\
\text{Layer4} & 24.47 & 0 & 19.08 & 0 & 22.94 & 0 & 20.85 & 0 & 21.70 & 0 & 22.93 & 0 & 19.44 & 0 & 19.50 & 0 & 0 & 0 & 0 & 12.16 & 12.16 & 0 & 0 \\
\text{Layer7} & 0 & 33.79 & 0 & 30.59 & 0 & 36.30 & 0 & 33.30 & 0 & 30.60 & 0 & 32.99 & 0 & 35.38 & 0 & 32.08 & 0. & 31.30 & 0 & 0 & 0 & 0 & 31.34 \\
\text{Layer2} & 31.63 & 0 & 26.24 & 0 & 30.10 & 0 & 28.01 & 0 & 28.86 & 0 & 30.09 & 0 & 26.60 & 0 & 26.66 & 0 & 0 & 0 & 16.40 & 16.40 & 0 & 0 & 0 \\
\text{Layer5} & 0 & 47.79 & 0 & 44.59 & 0 & 50.30 & 0 & 47.30 & 0 & 44.60 & 0 & 46.99 & 0 & 49.38 & 0 & 46.08 & 0 & 0 & 0 & 0 & 29.66 & 29.66 & 0
\end{bmatrix}$$

METHOD AND APPARATUS FOR PERFORMING DECODING USING LDPC CODE

TECHNICAL FIELD

The present invention relates to a decoding scheme, and more particularly, to a method and apparatus for performing decoding using a low density parity check (LDPC) code.

BACKGROUND ART

Recently, a method of encoding data using LDPC code has been highlighted. As most elements of a parity check matrix H are '0', the LDPC code has been suggested as a linear block code of low density by Gallager in 1962. The LDPC code could not have been implemented by hardware technique at that time due to its complexity. Although the LDPC code has not attracted attention at that time, its excellent performance of the LDPC code has been approved in 1995. Thus, studies of the LDPC code have been actively made since 1995. (References: [1] Robert G. Gallager, "Low-Density Parity-Check Codes", The MIT Press, Sep. 15, 1963, [2] D. J. C. Mackay, Good error-correcting codes based on very sparse matrices, IEEE Trans. Inform. Theory, IT-45, pp. 399-431(1999)) 2 0 Since a parity check matrix of the LDPC code has a very small number of elements of 1, decoding can be performed through repetitive decoding even in a very great block size, whereby its performance is approximate to channel capacity limitation of Shannon like turbo code if the block size becomes very great. In the parity check matrix, the number of 1 included in rows or columns will be referred to as weight.

The LDPC code can be explained by a parity check matrix H of (n−k)×n. A generator matrix G corresponding to the parity check matrix H can be obtained by the following equation 1.

$$H \cdot G = 0 \quad [\text{Equation 1}]$$

In the method of encoding and decoding data using LDPC code, a transmitter can encode input data using the generator matrix G in accordance with the following equation 2, wherein the generator matrix G has a relation of equation 1 with the parity check matrix H.

$$c = G \cdot x \text{ (wherein, } c \text{ is a codeword and } x \text{ is an information bit)} \quad [\text{Equation 2}]$$

Hereinafter, a method of decoding data using the matrix H in accordance with the related art will be described.

A decoder of a receiver should obtain an information bit (x) from the codeword that is the encoding result of the transmitter. In this case, the decoder uses a feature of Hc=0. Namely, supposing that a received codeword is c', the decoder calculates the value of Hc'. If the calculated result is 0, the decoder determines k number of bits in front of c' as decoded information bits. If the value of Hc' is not 0, the decoder obtains c' which satisfies 0 using a sum-product algorithm through a graph, a belief algorithm, etc., thereby recovering x. The aforementioned check equation, Hc'=0 can be changed to c'H$^T$=0 in accordance with the relation between the information bit and the matrix G.

FIG. 1 is a diagram illustrating a parity check matrix H through a bipartite graph. In FIG. 1, CNU represents a check node unit, and VNU represents a variable node unit. The decoding procedure using an algorithm on the bipartite graph includes the following three steps:

1. probability value update from a check node to a variable node;
2. probability value update from a variable node to a check node; and
3. decision of a decoding value through probability of a variable node.

First of all, the first step of performing update of the check node is performed through an initialization step, wherein a probability value received from a channel is input in the initialization step. After the first step is performed, if the probability value from the variable node to the check node is updated, the second step is performed. After the first and second steps are performed, the decoding value is decided using the probability value received from the channel and the probability value updated through the first and second steps.

The decoding procedure includes deciding the value c' as the decoded value if the decided decoding value c' satisfies a check equation Hc'=0, or includes iterating the first and second steps until the decoding value c' satisfies the check equation if not so. The probability value update steps are performed in the first step and the second step in such a manner that each update step is iterated by the number of non-zero elements, i.e., '1' belonging to each row or column of the parity check matrix. Namely, the check to variable update step of the first step are and the variable to check update step of the second step are performed in the position corresponding to the weight of the parity check matrix H. As the first and second steps are iterated, reliability of the probability value between the check node and the variable node is improved, and, as a result, the probability value is approximated to a true value of the codeword to be obtained.

For recent LDPC encoding, a method for encoding input data using the parity check matrix H without the generator matrix G is generally used. As described above, the parity check matrix H may be the most important factor in the encoding method using an LDPC code. Since the parity check matrix H has a size more than 1000×2000, approximately, problems occur in that the parity check matrix H requires many processing steps in the encoding and decoding steps, is accompanied with complexity in its application, and requires a lot of storage areas.

DISCLOSURE OF THE INVENTION

Accordingly, the present invention is directed to a method of performing decoding using an LDPC code, which substantially obviate one or more problems due to limitations and disadvantages of the related art.

An object of the present invention is to provide a method of performing decoding using an LDPC code, which can improve decoding throughput and reduce decoding latency during decoding using the LDPC code.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of performing decoding an encoded codeword using a parity check matrix, comprises decoding the codeword using the parity check matrix, wherein the parity check matrix includes a plurality of layers, each of the plurality of layers including at least one row split exclusively from a specific row of a base parity check matrix.

An apparatus for performing decoding an encoded codeword using a parity check matrix in accordance with another aspect of the present invention, comprises a decoder decoding the codeword using the parity check matrix, wherein the parity check matrix includes a plurality of layers, each of the plurality of layers including at least one row split exclusively from a specific row of a base parity check matrix.

According to the present invention, it is possible to improve decoding performance during decoding using the LDPC code. Also, it is possible to reduce decoding latency owing to efficient parallel processing.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 2 is a diagram illustrating an example of a model matrix;

FIG. 3 is a diagram illustrating a method of expressing a matrix according to shift numbers;

FIG. 4 is a diagram illustrating a model matrix for each layer;

FIG. 5A is a diagram illustrating a concept of parallel processing;

FIG. 5B is a diagram illustrating a concept of memory access collision according to parallel processing;

FIG. 6 is a diagram illustrating an example of a base matrix when a code rate is 1/2;

FIG. 7 is a diagram illustrating another example of a base matrix when a code rate is 1/2;

FIG. 8A to FIG. 8D are diagrams illustrating a method of generating a parity check matrix, which enables efficient parallel processing during decoding by exclusively splitting at least one row of a base parity check matrix into at least two in accordance with one embodiment of the present invention;

FIG. 13A to FIG. 13I are block diagrams illustrating steps from performing initialization to performing one iteration decoding when LDPC decoding to which parallel processing is applied is performed.

BEST MODE FOR CARRYING OUT THE INVENTION

Figure 1:
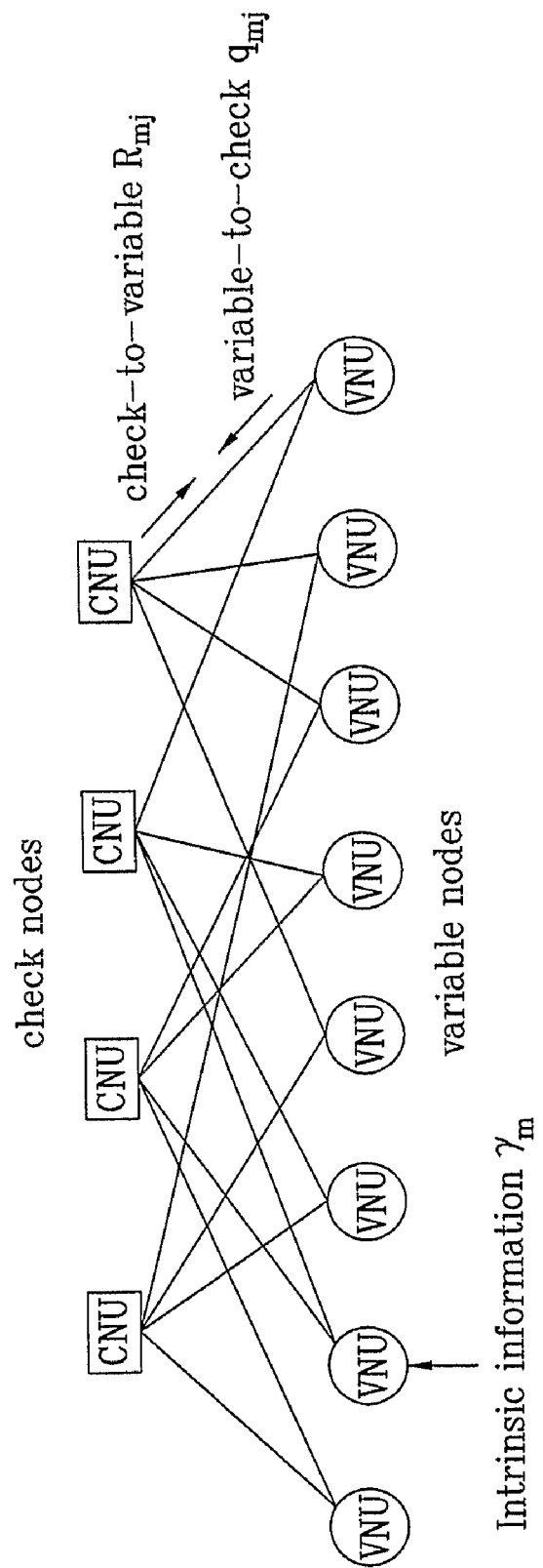
FIG. 1 is a diagram illustrating a parity check matrix H through a bipartite graph.

Hereinafter, structures, operations, and advantages of the present invention will be understood readily by the preferred embodiments of the present invention, examples of which are illustrated in the accompanying drawings.

Since the embodiments of the present invention are based on a method of encoding and decoding using a structured LDPC, a method of encoding and decoding data using a structured LDPC will be described hereinafter.

A parity check matrix is used to use an LDPC code. As described above, the parity check matrix is a binary matrix and includes elements, most of which are '0' and some of which are '1.' Since the parity check matrix actually used for encoding or decoding has a size of $10^5$ bits or greater, a large-scaled memory is required to store the parity check matrix.

In a method of encoding data using a structured LDPC, a parity check matrix is stored in a type of a model matrix. The model matrix includes a plurality of indexes, each of which indicates a specific sub-matrix. In other words, each sub-matrix is a matrix of a constant size (z×z) and is expressed by a specific index. Each index of the model matrix is replaced with a sub-matrix indicated by the corresponding index when encoding or decoding is performed, whereby the model matrix is used by being expanded to the parity check matrix.

Figures 2, 3:
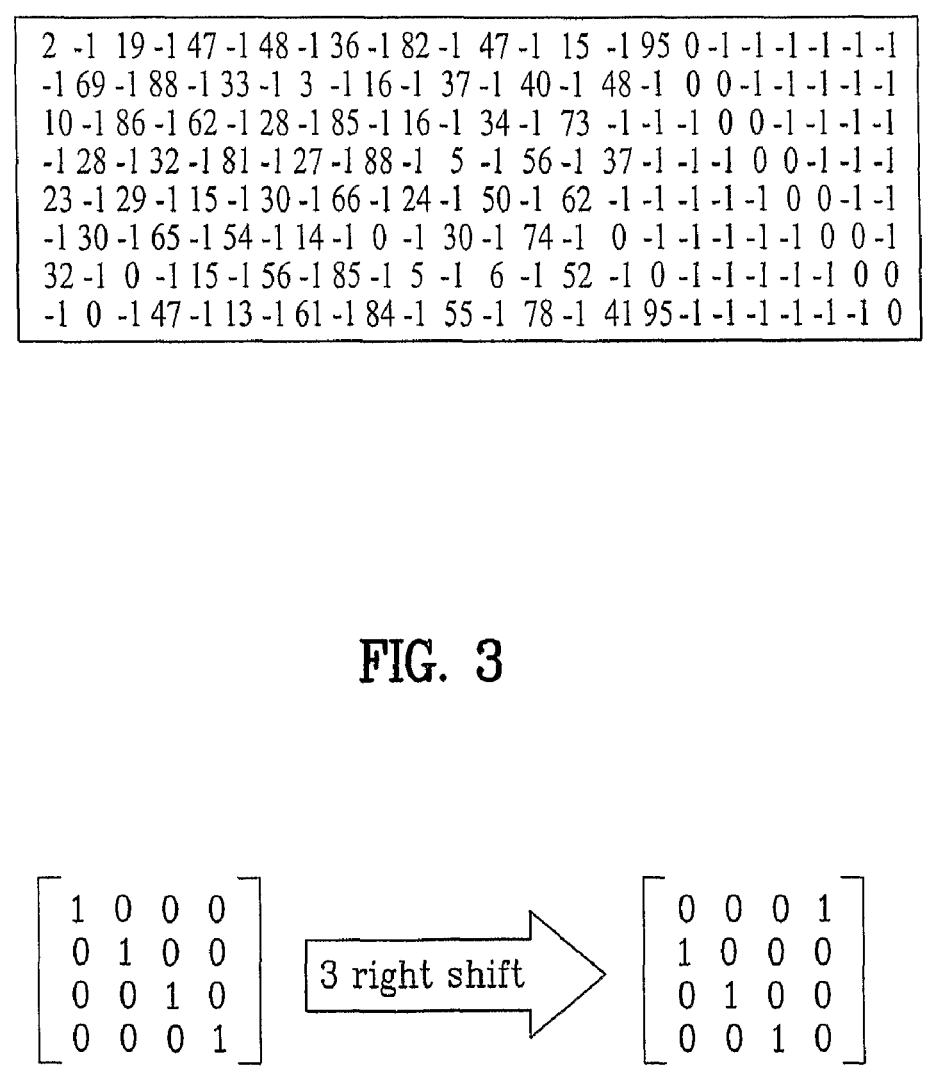

FIG. 2 is a diagram illustrating an example of the model matrix. In FIG. 2, each integer means an index of a corresponding sub-matrix. For example, if the index is equal to '−1,' a sub-matrix having the index of '−1' means a zero matrix of a specific size. If the index is equal to '0,' a sub-matrix having the index of '0' means an identity matrix of a specific size. Also, indexes excluding '−1' and '0,' which are positive integers, can mean a predetermined rule which generates a corresponding sub-matrix. For example, indexes which are positive integers represent shift values. In other words, supposing that each sub-matrix is a permutation matrix generated by shifting each row or column of the identity matrix in a constant direction, the shift value could be an index of the corresponding sub-matrix. For example, if a sub-matrix is expressed by an index of '1,' the corresponding sub-matrix is generated by shifting each row or column of the identity matrix by one space (row or column) in a specific direction. No index may be used in the model matrix, so as to express a sub-matrix which is a zero matrix. In the embodiments which will be described later, no index may be used to express a sub-matrix which is a zero matrix.

FIG. 3 is a diagram illustrating a method of expressing a matrix according to the aforementioned indexes, i.e., shift numbers. When a specific parity check matrix is structured as a matrix (i.e., sub-matrix) of 4×4 size, a sub-matrix having an index of '3' becomes a permutation matrix generated by shifting each column of the base permutation matrix of 4×4 size, i.e., the identity matrix to the right by three columns.

Memory capacity for storing the parity check matrix can be saved in such a manner that a model matrix obtained by expressing each sub-matrix by one index is stored in accordance with a structured LDPC scheme and a model matrix stored during encoding or decoding is expanded to its original parity check matrix.

Hereinafter, a method of decoding an LDPC code using the parity check matrix will be described. Decoding of an LDPC code according to the related art is performed by iteration of update of a probability value between a check node and a variable node on a bipartite graph to improve reliability, wherein the bipartite graph is another expression of the parity check matrix. In the method of decoding an LDPC code using a bipartite graph which is another expression of the parity check matrix, since a codeword is determined through the updated probability value, the update step of the probability value directly affects throughput of a decoder.

The update step of reliability can be divided into an update procedure of a probability value from a check node to a variable node and an update procedure of a probability value from the variable node to the check node. When updating the probability value from the check node to the variable node or updating the probability value from the variable node to the check node, the decoder updates its probability value using a probability value in same columns or rows excluding its value. At this time, the decoder obtains higher reliability depending on how many times the probability value is updated.

In one embodiment of the present invention, when the received signal which has been LDPC encoded is decoded using the parity check matrix, a method (hereinafter, referred to as 'layered decoding') of decoding a received signal in a unit of layer which is a bundle of rows of the parity check matrix is used. The layered decoding is characterized in that the probability value is updated using the updated value already included in same columns of the parity check matrix when the probability is updated from the variable node to the check node.

The layered decoding is to iteratively decode rows of the parity check matrix used for encoding and decoding of the LDPC code in a unit of several layers. The layers represent groups of the respective rows when the rows of the parity check matrix are grouped. Namely, when the rows of the parity check matrix are grouped by several groups, one group can be referred to as a layer. One layer may comprise one row.

Figure 4:
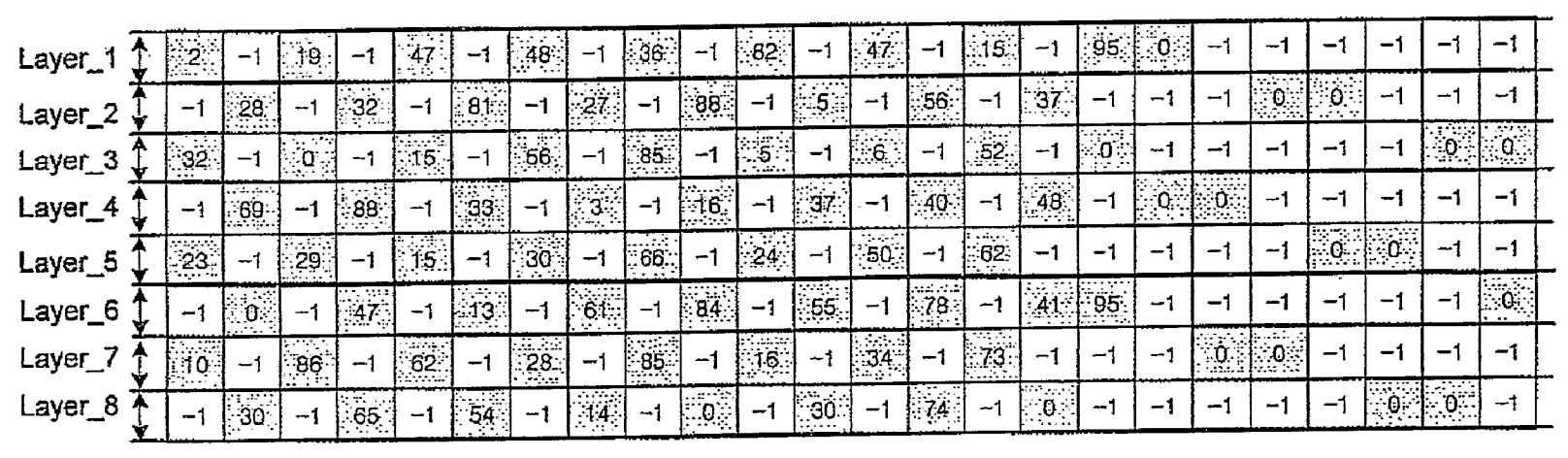

FIG. 4 is a diagram illustrating a model matrix divided in a unit of layer. The model matrix illustrated in FIG. 4 is an example for describing the layered decoding. Each integer of FIG. 4 means index indicating a sub matrix.

According to the layered decoding, reliability in same rows of the parity check matrix H is updated using the probability value obtained through update steps of similar level. Namely, like the LDPC decoding method in accordance with the related art, the probability value between the check node and the variable node is performed on the bipartite graph. However, in case of the update step of the probability value from the variable node to the check node (i.e., the probability value update step of columns of the parity check matrix H), the probability value is updated in a unit of layer. If the probability value included in a specific layer is updated, the probability value included in the layer where update has been already performed is used. In the layered decoding, since decoding is performed in a unit of layer, if the probability value is updated for all of layers included in the parity check matrix, one iteration is performed for LDPC decoding. In the layered decoding, if processing for updating the probability value is performed for one layer and then processing for updating the probability value is performed for next layer, the processing result for the one layer, i.e., the updated reliability message result is used for the processing for the next layer, whereby the message having higher reliability is used for decoding, i.e., the probability value update step. In this way, if the probability value update is iterated, the message having higher reliability is used to update the probability value, whereby reliability of the probability value between the check node and the variable node is improved and thus the decoder obtains excellent throughput. The matrix of FIG. 4 is a general model matrix. In the matrix of FIG. 4, respective layers can be decoded sequentially by the layered decoding. For example, the layers can be decoded in the order of Layer 1->Layer 2->Layer 3->Layer 4->Layer 5->Layer 6->Layer 7->Layer 8.

Hereinafter, a basic concept of parallel processing during decoding used in one embodiment of the present invention and requirements for performing layered decoding in accordance with parallel processing will be described.

FIG. 5A is a diagram illustrating a concept of parallel processing. Parallel processing means that a processing step processed by one processing unit is performed by a plurality of processing units. As a result of parallel processing, the time required to perform one processing step is reduced in proportion to the number of processing blocks used for parallel processing.

FIG. 5B is a diagram illustrating a concept of memory contention. In case of serial processing, since one processing unit uses a memory block, a problem does not occur in reading out a processing value or storing a processing result. However, in case of parallel processing where several processing units are used simultaneously, memory collision may occur when two or more processing units access a memory block. If probability value update units for LDPC decoding access a single memory, memory collision may occur.

In order to apply parallel processing to LDPC decoding, both the problem caused by simultaneous access of processing units to a memory block and dependence between data to be simultaneously processed should be removed. In other words, if an output value of any one of a plurality of processing blocks should also be used as an input value of another processing block, processing should be performed for the output value of any one processing block and the input value of another processing block in due order depending on dependence.

In one embodiment of the present invention, to perform data processing for the specific layers in accordance with parallel processing, the parity check matrix having no overlap between the specific layers is provided. Sub matrixes not zero matrix of the specific layer of the parity check matrix according to one embodiment of the present invention exist in different positions along a column direction. Namely, the positions where weights of the parity check matrix exist in the specific layer are different from one another in a column direction.

As described above, according to the general LDPC decoding, the probability value within all rows of the parity check matrix is updated. Then, the probability value is updated for all columns of the parity check matrix. On the other hand, according to the layered decoding, the probability value is updated in a unit of groups (unit of layers) already divided when the probability of each row is updated. This layered decoding method improves decoding throughput by using the probability value having higher reliability than that of the already updated probability value when the probability value corresponding to the groups following the second group is updated. Although the layered decoding is advantageous as above, if the parity check matrix according to the related art is divided in a unit of a specific layer and data are processed for the specific layer in accordance with parallel processing, only one layer should be processed to avoid the problem of the aforementioned memory collision during parallel processing of the specific layers and the problem of dependence between the data processed in accordance with parallel processing. In this case, decoding latency occurs. However, as suggested in one embodiment of the present invention, if the parity check matrix is designed such that the positions where the weights of the columns between the specific layers exist are not overlapped with each other, parallel processing can simultaneously be performed for a plurality of layers.

Hereinafter, a method of performing layered decoding in accordance with parallel processing using a parity check matrix where overlap does not occur for specific layers will be described.

FIG. 6 is a diagram illustrating an example of a model matrix when a code rate is 1/2. In this example, rows of a parity check matrix generated by the model matrix of FIG. 6 are grouped into one layer in accordance with a size of a base permutation matrix of the model matrix. Namely, in the above example, a layer of the parity check matrix generated by the model matrix of FIG. 6 and the base permutation matrix is comprised of rows equivalent to the number of rows of the base permutation matrix. As a result, the number of rows included in one layer is equal to the number of rows of the base permutation matrix according to the model matrix of FIG. 6. The model matrix of FIG. 6 is suggested for effective parallel processing. For the layered decoding, the row order of the model matrix (base matrix) of FIG. 6 is defined in the order of (1→7→2→8→3→9→4→10→5→11→6→12), 'non-zero' elements are overlapped with one another in a random column direction with respect to two random rows (for example, the first row and the seventh row) of the model matrix. In the model matrix, elements having shift numbers more than 0 are not overlapped with one another in a column direction with respect to two random rows (for example, the first row and the seventh row). For example, it is noted that elements having shift numbers more than 0 are not overlapped with one another in a random column direction with respect to the eighth row as compared with the second row or the third row. Also, according to the parity check matrix generated by the model matrix of FIG. 6, one row of the model matrix represents one layer of the generated parity check matrix, wherein positions where weights exist are not overlapped with each other in a column direction in each layer of the generated parity check matrix.

FIG. 7 is a diagram illustrating another example of a model matrix when a code rate is 1/2. The model matrix of FIG. 7 is suggested for more effective parallel processing. The model matrix of FIG. 7 is designed such that elements having shift numbers more than 0 are not overlapped with one another in a random column direction with respect to each pair of rows (1, 7), (2, 8), (3, 9), (4, 10), (5, 11), (6, 12).

Hereinafter, a method of generating a parity check matrix to perform efficient parallel processing during decoding using the parity check matrix will be described. As described above, in order to perform parallel processing for a plurality of layers, the parity check matrix should be designed such that positions where weights of columns between the respective layers exist are not overlapped with each other. To this end, in one embodiment of the present invention, at least one row of the base model matrix is split into two or more rows to generate a new model matrix, wherein elements having column weight are exclusively split. When the elements having column weight are exclusively split, columns corresponding to two split rows do not have a weight simultaneously.

Figure 8B:
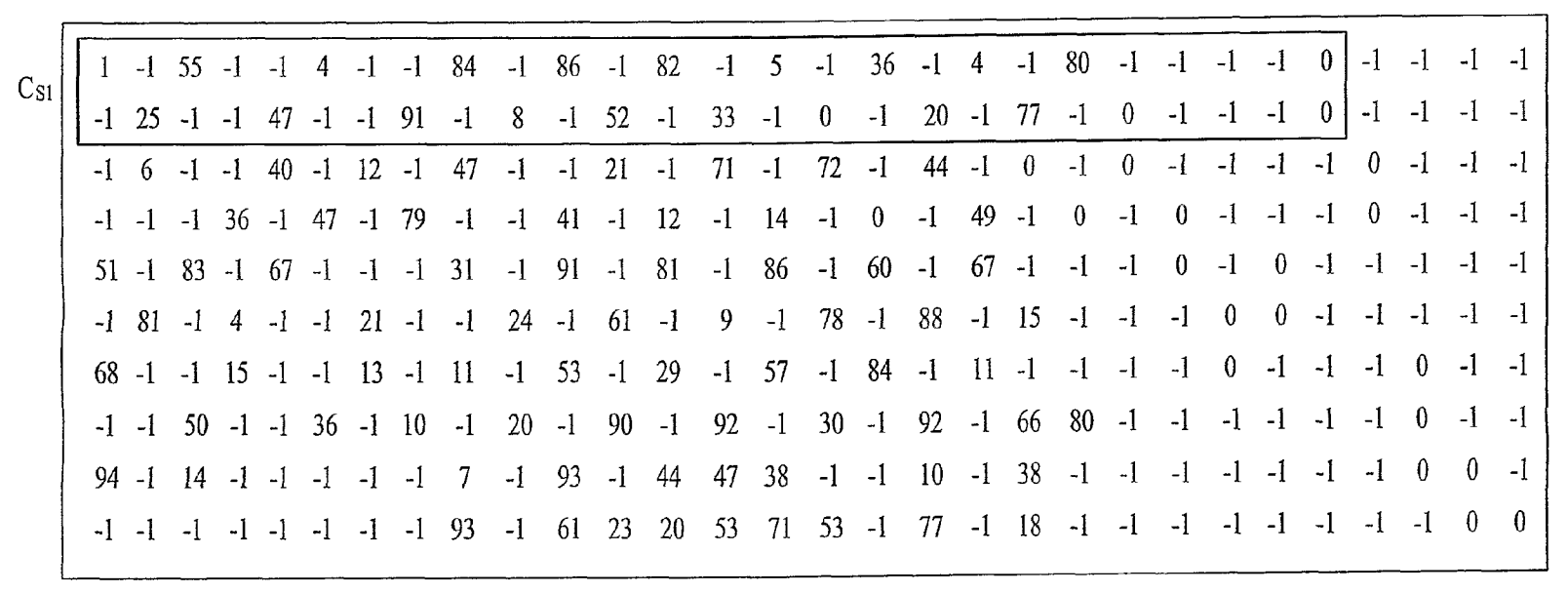

FIG. 8A to FIG. 8D are diagrams illustrating a method of generating a parity check matrix, which enables efficient parallel processing during decoding by exclusively splitting at least one or more row of a base parity check matrix into two or more rows, FIG. 8A illustrates an example of a base parity check matrix according to one embodiment of the present invention, which has a dimension of 4×24. FIG. 8B illustrates a parity check matrix of 10×30 size, which is generated by splitting each row of the base parity check matrix of FIG. 8A into two rows and separately adding two rows. In FIG. 8B, the first and second rows, the third and fourth rows, the fifth and sixth rows, the seventh and eighth rows are respectively generated by being split from the first row, the second row, the third row and the fourth row of FIG. 8A, and the ninth and tenth rows of FIG. 8B are separately added.

Elements having column weight in the split row are exclusively split. Namely, the elements are split such that the columns corresponding to two split rows do not have a weight simultaneously. In more detail, the elements having weight are split in such a manner that elements having an odd numbered weight in the first row of FIG. 8A are located in the column corresponding to the first row of the two split rows of FIG. 8B, and elements having an even numbered weight are located in the column corresponding to the second row of the split rows of FIG. 8B. In case of elements (index '−1') having no weight in the first row of FIG. 8A, the elements are split such that columns corresponding to the two split rows of FIG. 8B do not have a weight. Namely, the columns corresponding to the elements having no weight do not have a weight even after the elements are split. Hereinafter, when a specific row is split into two or more rows, the feature that elements having column weight are exclusively split is equally applied to the rows.

Furthermore, a new parity part is added to parity parts of the two split rows. At this time, when a new parity check matrix is generated by splitting one or more rows, a new parity part is additionally provided so that the number of rows of the parity part of the newly generated parity check matrix is equal to the number of columns of the parity part. For example, if two rows are added to the new parity check matrix by splitting the row, an additional parity part having two columns is added to the parity part.

FIG. 8C illustrates a part of a parity check matrix of 20×40 dimension, which is generated by splitting each row of the parity check matrix of FIG. 8B into two rows. Namely, FIG. 8C illustrate that the first row and the second row of FIG. 8B are respectively split into two rows.

FIG. 8D illustrates a part of a parity check matrix of 40×60 dimension, which is generated by splitting each row of the parity check matrix of FIG. 8C into two rows. Namely, FIG. 8D illustrate that four rows illustrated in FIG. 8C are respectively split into two rows to generate eight rows.

In FIG. 8A to FIG. 8D, the first row of FIG. 8A is split into eight rows through sequential spit steps as described with reference to FIG. 8B, FIG. 8C and FIG. 8D. At this time, the first and second rows of FIG. 8B are generated by the first split and will be referred to as a first check node set ($C_{S1}$), the first to fourth rows of FIG. 8C are generated by the second split and will be referred to as a second check node set ($C_{S2}$), and the first to eighth rows of FIG. 8D are generated by the third split and will be referred to as a third check node set ($C_{S3}$). In this way, rows are generated by N times iterative split of specific rows of the base parity check matrix and can be referred to as the Nth check node set ($C_{SN}$).

In the above example, if one row is split to generate two rows, its elements having column weight are exclusively split. Accordingly, if two subsequent rows corresponding to the $N_{th}$ check node set ($C_{SN}$) are grouped into one group, a random row belonging to a specific group, i.e., a random check node does not cause collision with a random check node belonging to another group. For example, in FIG. 8D, if two subsequent rows (check nodes) are grouped into one group, a total of four groups are generated, a random check node of the first group does not cause collision with a random check node belonging to another group.

If the number of processing steps that can perform decoding in parallel during decoding using the parity check matrix is a parallel factor, the number of parallel factors is four in FIG. 8D. In other words, decoding steps of random check nodes belonging to each of the four groups can simultaneously be processed in parallel. If the first check node belonging to each group is represented by '1' and the second check node is represented by '0', number of cases that can perform scheduling to process a decoding processor in parallel are as illustrated in Table 1 below.

TABLE 1

| First group | Second group | Third group | Fourth group |
|---|---|---|---|
| 0 | 0 | 0 | 0 |
| 0 | 0 | 0 | 1 |
| 0 | 0 | 1 | 0 |
| 0 | 1 | 1 | 1 |
| 0 | 0 | 0 | 0 |
| 0 | 1 | 0 | 1 |
| 0 | 1 | 1 | 0 |
| 0 | 1 | 1 | 1 |
| 1 | 0 | 0 | 0 |
| 1 | 0 | 0 | 1 |
| 1 | 0 | 1 | 0 |
| 1 | 0 | 1 | 1 |
| 1 | 1 | 0 | 0 |
| 1 | 1 | 0 | 1 |
| 1 | 1 | 1 | 0 |
| 1 | 1 | 1 | 1 |

As described above, if decoding is performed using the parity check matrix generated by splitting rows of the base parity check matrix in accordance with one embodiment of the present invention, decoding throughput can be improved, and efficient parallel processing can be performed, whereby decoding latency can be reduced.

Figure 9:
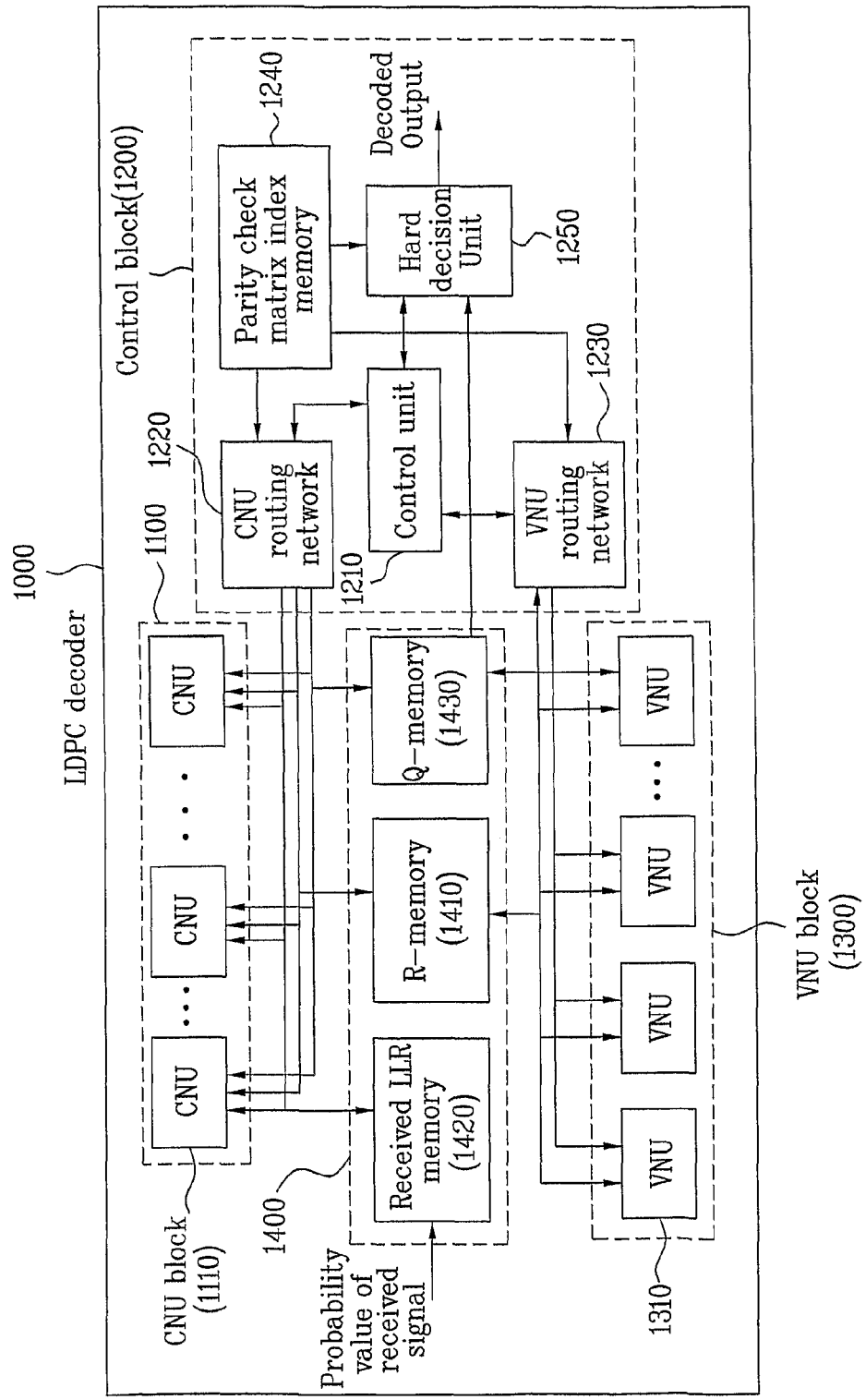
FIG. 9 is a block diagram illustrating an example of an LDPC decoder according to one embodiment of the present invention.
Figure 10:
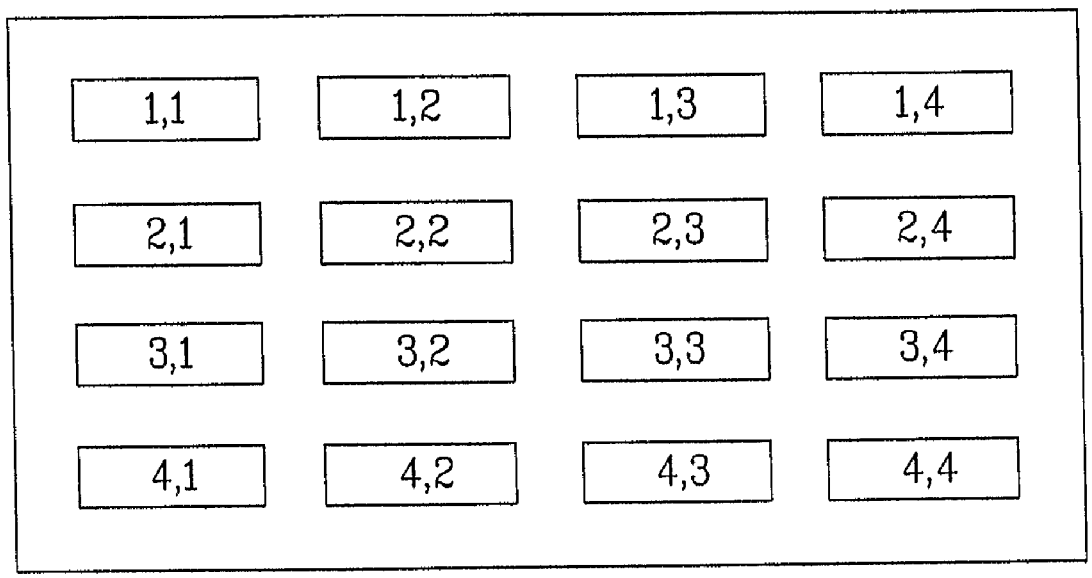
FIG. 10 is a block diagram illustrating a memory structure of an LDPC decoder according to one embodiment of the present invention.

Hereinafter, a decoder which performs decoding using a parity check matrix according to the embodiment of the present invention will be described. FIG. 9 is a block diagram illustrating an example of an LDPC decoder according to one embodiment of the present invention;

FIG. 10 is a block diagram illustrating a memory structure of an LDPC decoder according to one embodiment of the present invention. The LDPC decoder 1000 includes a check node update unit (CNU) block 1100, a control block 1200, a variable node update unit (VNU) block 1300, and a memory block 1400. The CNU block 1100 performs check node update, and includes at least one check node update unit (CNU) 1110. The CNU block 1100 is a processing unit that performs probability value update of the check node (check node update). The control block 1200 includes a control unit 1210 controlling an operation of each unit of the decoder 1000, a CNU routing network 1220 controlling the CNU Block 1100 and the memory block 1400 in accordance with a structure of the parity check matrix, a VNU routing network 1230 controlling the VNU block and the memory block 1400, a parity check matrix index memory 1240 storing information of a structure of the parity check matrix, and a hard decision unit 1250 deciding a decoding value using the updated probability value and checking the decided decoding value. The VNU block 1300 performs probability value update of the variable node (variable node update), and includes at least one VNU unit 1310. The VNU unit 1310 is a processing unit that performs probability value update of the check node. The CNU 1110 and the VNU 1310 controlled by the control block 1200 update the probability value by calculating the probability value for elements of the matrix H not zero elements, wherein the calculated probability value is stored in the memory block 1400. The memory block 1400 includes an R-memory 1410 storing the probability value calculated for probability value update from the check node to the variable node, a received LLR memory 1420 storing a probability value (for example, a log likelihood ratio value received from a radio channel) calculated for probability value update from the variable node to the check node, and a Q-memory 1430 storing a probability value calculated for probability value update from the variable node to the check node.

Each unit will be described below. The received LLR memory 1420 is a memory that can store probability values of a received signal to be decoded, for example, LLR value of codeword of the received signal. Also, the R-memory 1410 stores the result ($R_{mj}$) of the check node update in a specific check node, and the Q-memory 1430 stores the result ($L(q_{mj})$) of the variable node update according to a specific variable node. The control unit 1210 controls an operation order of each unit and operation timing of each unit, and the parity check matrix index memory 1240 stores information of position of weight of the parity check matrix. Also, the CNU routing network 1220 acquires information of the parity check matrix from the parity check matrix index memory 1240 and then properly connects the CNU 1110 with the memories of the memory block 1400. Also, the VNU routing network 1230 acquires information of the parity check matrix from the parity check matrix index memory 1240 and then properly connects the VNU 1310 with the memories of the memory block 1400. The hard decision unit 1250 decides a decoding value using the Q-memory 1430 and checks the decided decoding value (c'). If the decoding value (c') satisfies Hc'=0, the hard decision unit 1250 outputs the decoding value (c') as a true value. If not so, the hard decision unit 1250 repeats decoding within the maximum number of iteration decoding times.

The decoder 1000 of FIG. 9 can decode the received signal using the parity check matrix stored in a separate memory (not shown) or the parity check matrix index memory 1240, or can decode the received signal using the parity check matrix generated through the model matrix and the base permutation matrix. If the parity check matrix is generated through the model matrix and the base permutation matrix, it is preferable that the decoder 1000 includes a memory (not shown) storing the base matrix and the base permutation matrix, and a parity check matrix generator (not shown) generating the parity check matrix using the base matrix and the base permutation matrix. Also, the decoder 1000 of FIG. 9 can generate a new parity check matrix by controlling the order (for example, the order of layers) of rows of the parity check matrix. In this case, it is preferable that the decoder 1000 includes a parity check matrix control unit (not shown) controlling the order of rows of the parity check matrix.

Hereinafter, the operation of the LDPC decoder 1000 will be described. The LDPC decoder 1000 can perform decoding using a log belief propagation (log BP) algorithm which is one of LDPC decoding algorithms. The decoder 1000 performs the operation in accordance with an initialization step, a check node update step, a variable node update step, and a hard decision step. The initialization step includes storing the probability value of the received signal transmitted from the transmitter in the received LLR memory 1420, and storing the probability value stored in the received LLR memory 1420 in a specific position of the Q-memory 1430 using weight information of the parity check matrix stored in the parity check matrix index memory 1240. The check node update step includes performing check node update, i.e., update from the check node to the variable node using the probability value stored in the Q-memory 1430, and storing the result in the R-memory 1410. The variable node update step includes perfatining variable node update, i.e., update from the variable node to the check node using the probability value stored in the R-memory 1410, and storing the result in the Q-memory 1430. The hard decision step includes temporarily deciding the decoding value (c') using the probability value stored in the Q-memory 1430, checking the decided decoding value (c'), outputting a true value if the decoding value (c') is the true value in accordance with the check result, and iterating the check node update step and the variable node update step within the specific number of iteration times if the decoding value (c') is not the true value.

$$H = \begin{bmatrix} 1 & 1 & 1 & 0 & 1 & 0 & 0 & 0 \\ 0 & 1 & 1 & 1 & 0 & 1 & 0 & 0 \\ 1 & 0 & 1 & 1 & 0 & 0 & 1 & 0 \\ 1 & 1 & 0 & 1 & 0 & 0 & 0 & 1 \end{bmatrix} \quad \text{[Equation 3]}$$

When the parity check matrix H used in the decoder 1000 is equal to the Equation 3 above, the R-memory 1410 and the Q-memory 1430 serve to store position values of non-zero elements of the parity check matrix, i.e., elements where 1 exists. Accordingly, the R-memory 1410 and the Q-memory 1430 serve to store the position values as follows.

$$\begin{bmatrix} \# & \# & \# & \_ & \# & \_ & \_ & \_ \\ \_ & \# & \# & \# & \_ & \# & \_ & \_ \\ \# & \_ & \# & \# & \_ & \_ & \# & \_ \\ \# & \# & \_ & \# & \_ & \_ & \_ & \# \end{bmatrix}$$

However, since the R-memory 1410 and the Q-memory 1430 store only values corresponding to positions of the non-zero elements, they can store the processing result for the probability value update in accordance with the structure of FIG. 10. Accordingly, the memory required for LDPC decoding is proportional to the weight of the matrix H. Position information of weight of the parity check matrix illustrated in FIG. 10 is stored in the parity check matrix index memory 1240. As described above, the decoder 1000 can perform decoding by generating the parity check matrix using the model matrix and the base permutation matrix, perform decoding using the parity check matrix stored in a specific memory, or perform decoding using the parity check matrix generated by a random method. The parity check matrix which will be described later will mean the real parity check matrix not the mode matrix. There is no limitation in the method of generating a parity check matrix. The parity check matrix may be generated using the model matrix and the base permutation matrix, or the parity check matrix may be generated by acquiring the parity check matrix stored in a specific memory or an external unit.

Figure 11:
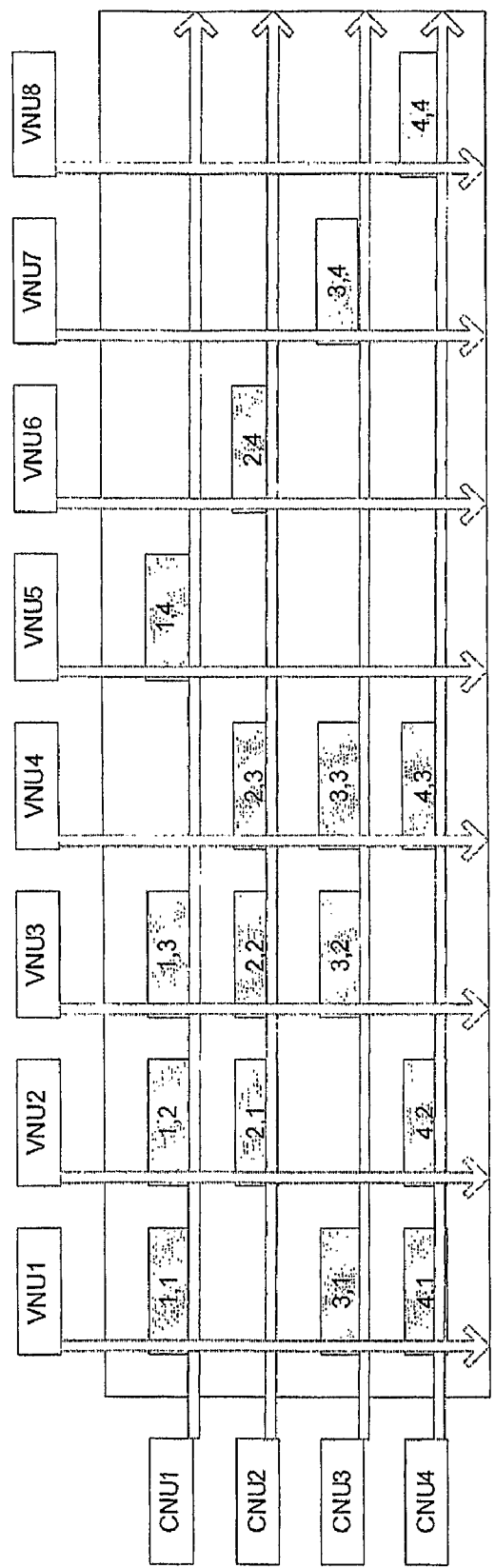
FIG. 11 is a block diagram illustrating a connection type of hardware of an LDPC decoder according to one embodiment of the present invention.

FIG. 11 is a block diagram illustrating a connection type of CNUs, VNUs, memories of the LDPC decoder which performs decoding using the parity check matrix of the Equation 3. The decoder of FIG. 11 exemplarily includes four CNUs and eight VNUs. FIG. 12A to FIG. 12H are block diagrams illustrating steps from performing initialization where the probability value of the received signal is input to performing one iteration decoding, when decoding is performed using the decoder illustrated in FIG. 11. Coordinates expressed in the R-memory 1410 and the Q-memory 1430 of FIG. 12A to FIG. 12H represent memory addresses when the memories are expressed as illustrated in FIG. 10.

Figure 12A:
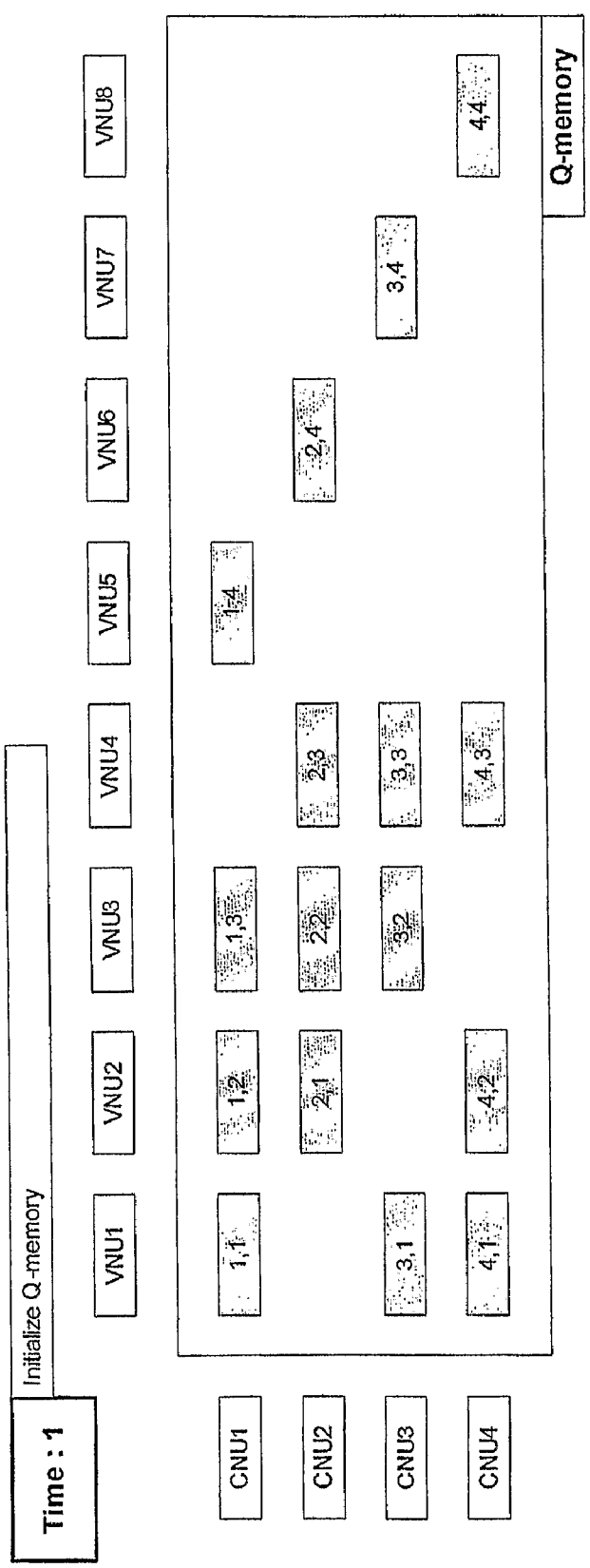
FIG. 12A to FIG. 12H are block diagrams illustrating steps from performing initialization to performing one iteration decoding when LDPC decoding is performed.
Figure 12B:
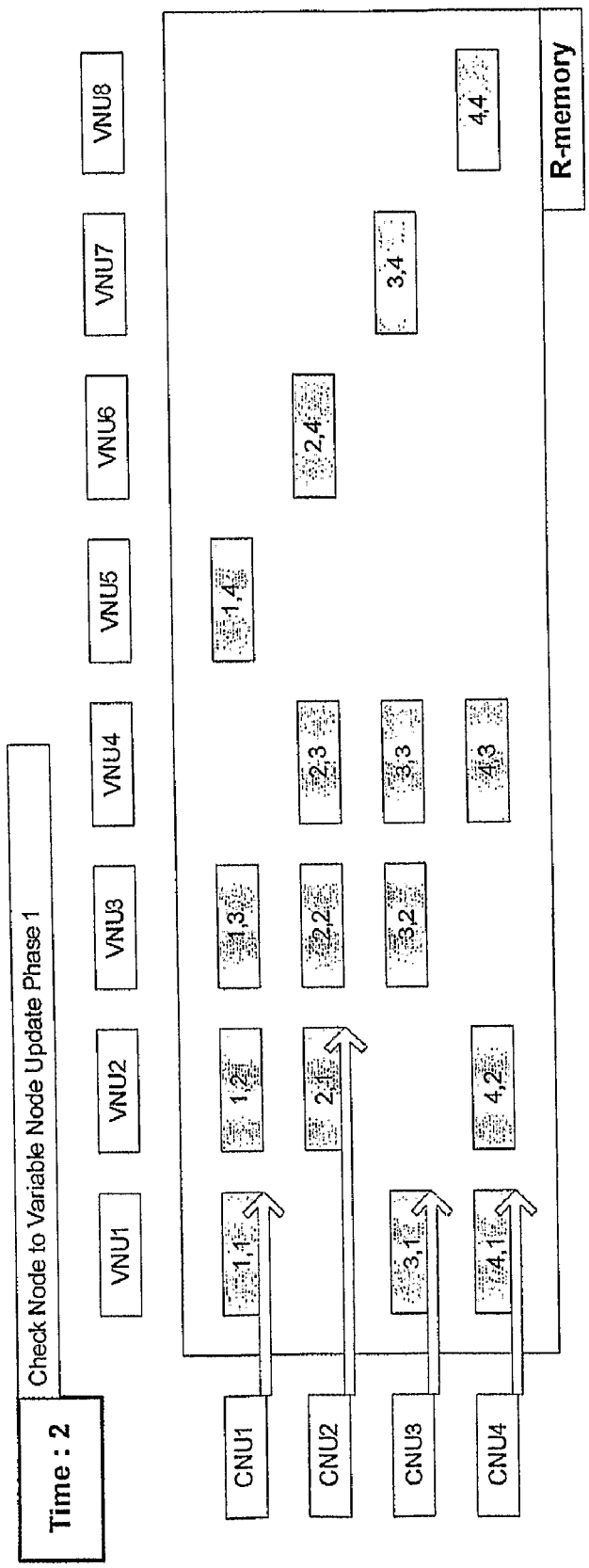
Figure 12C:
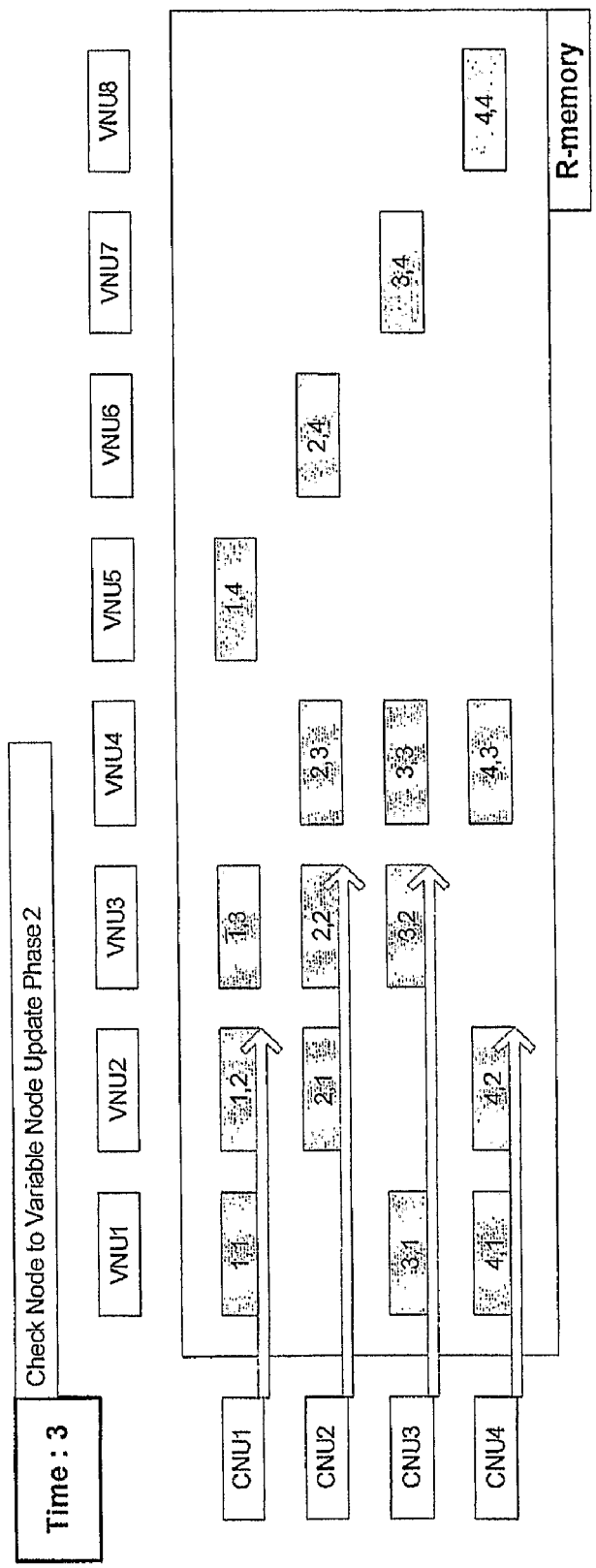
Figure 12D:
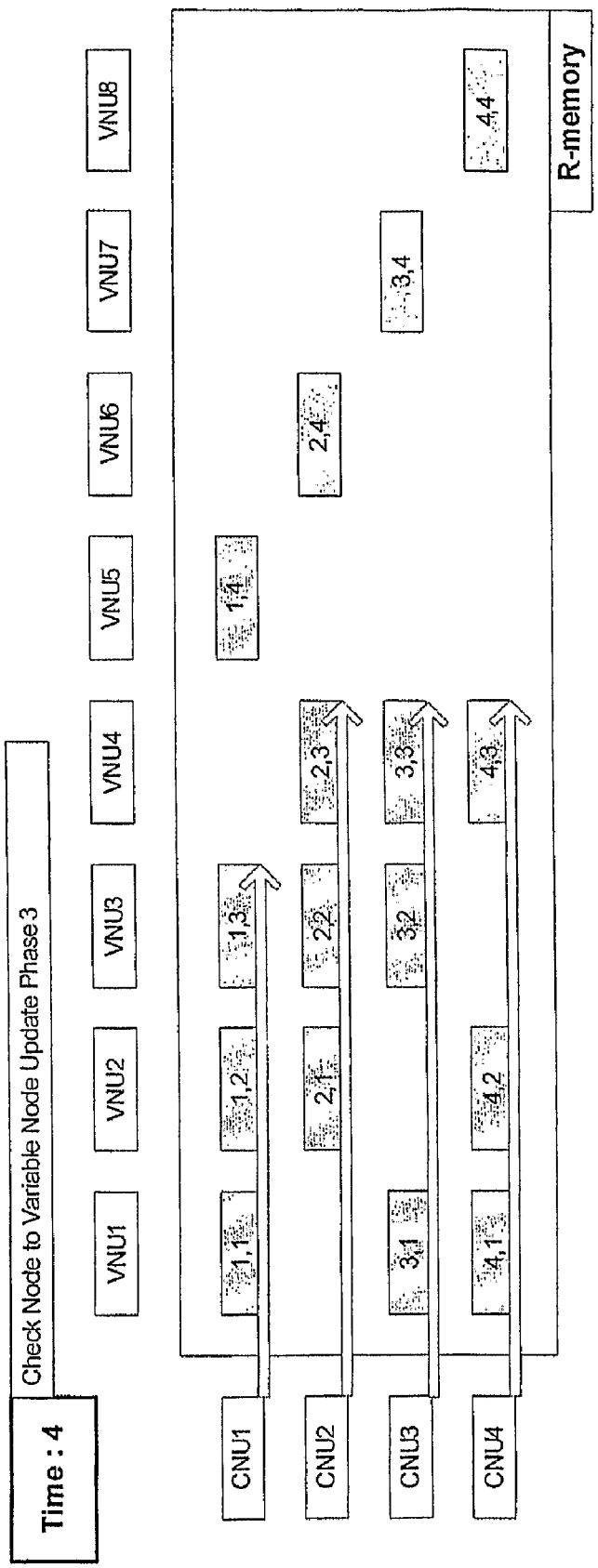
Figure 12E:
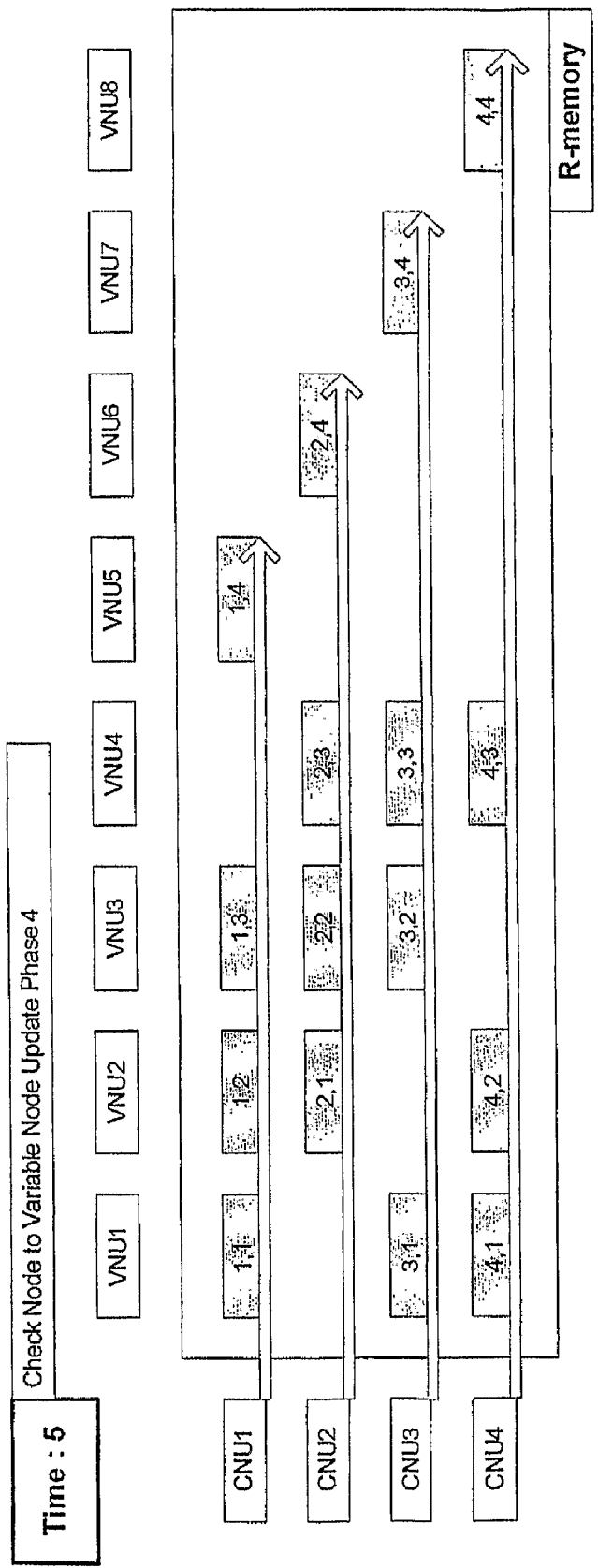

FIG. 12A illustrates an initialization step for LDPC decoding. Elements expressed in FIG. 12A represent non-zero elements in the parity check matrix, and the probability value received from the transmitter is input to a memory address corresponding to the non-zero elements.

Figure 12F:
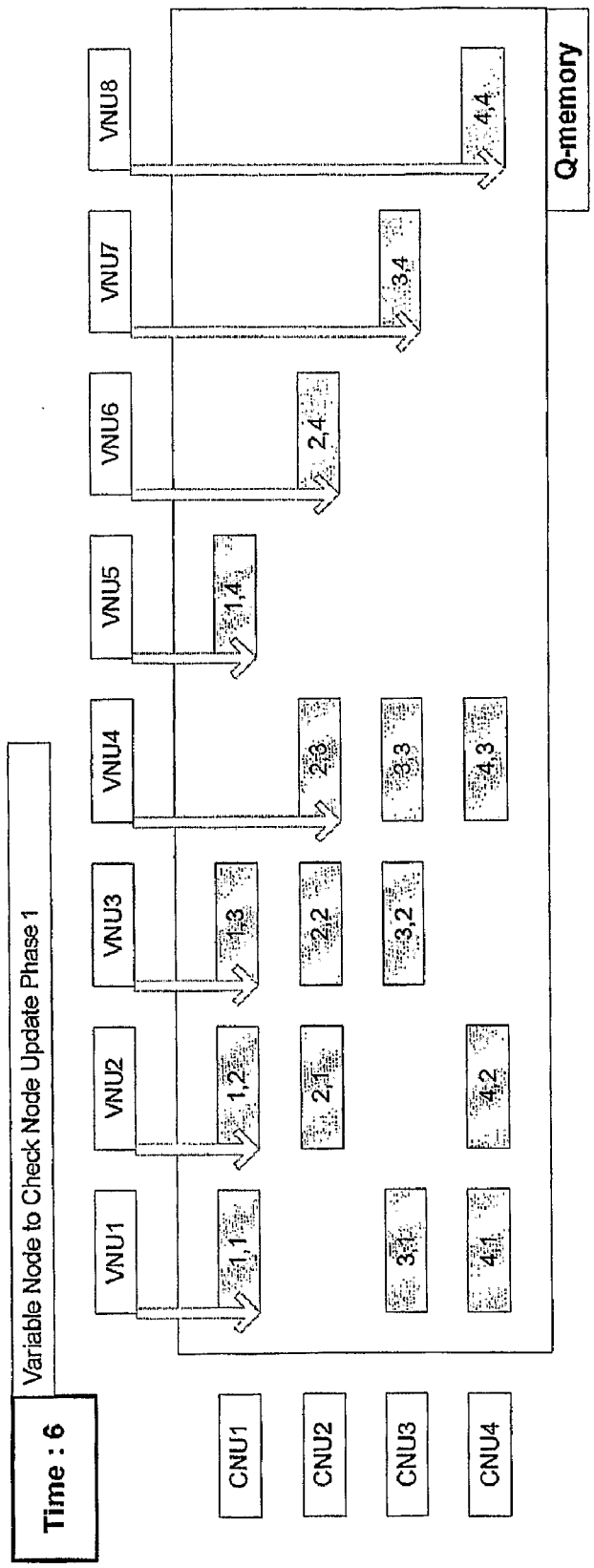
Figure 12G:
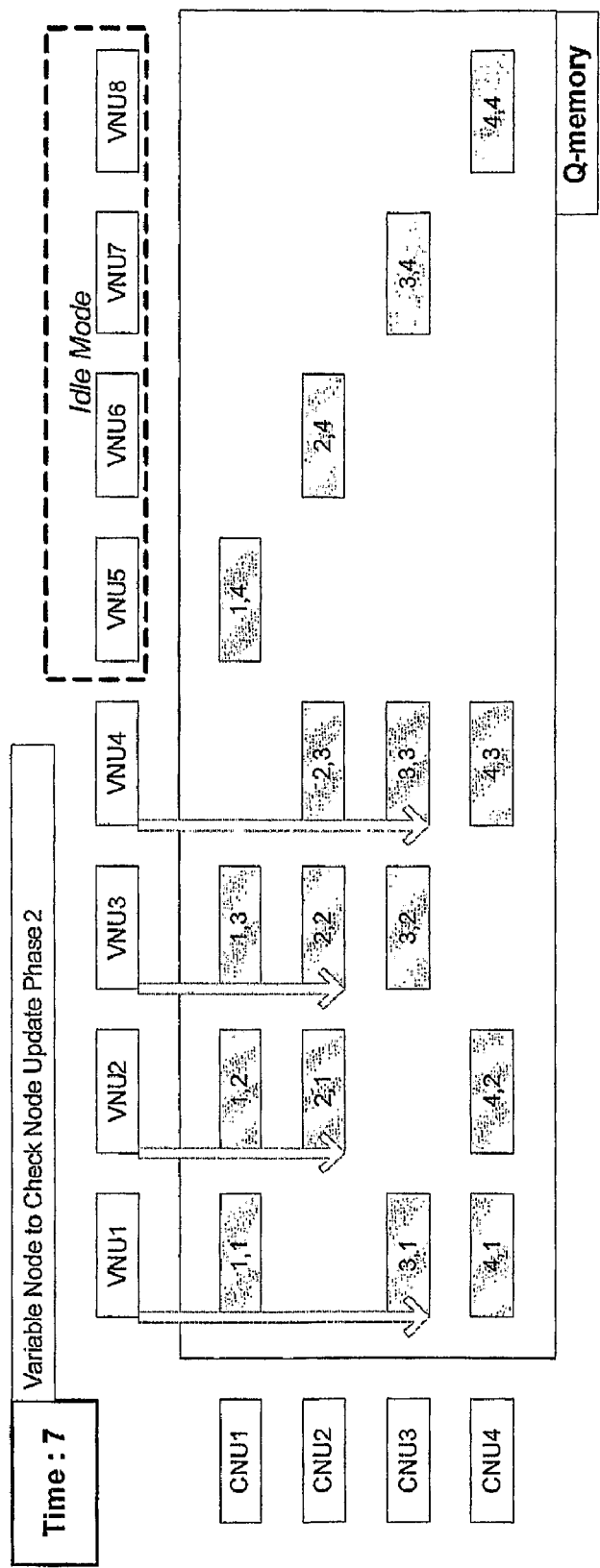
Figure 12H:
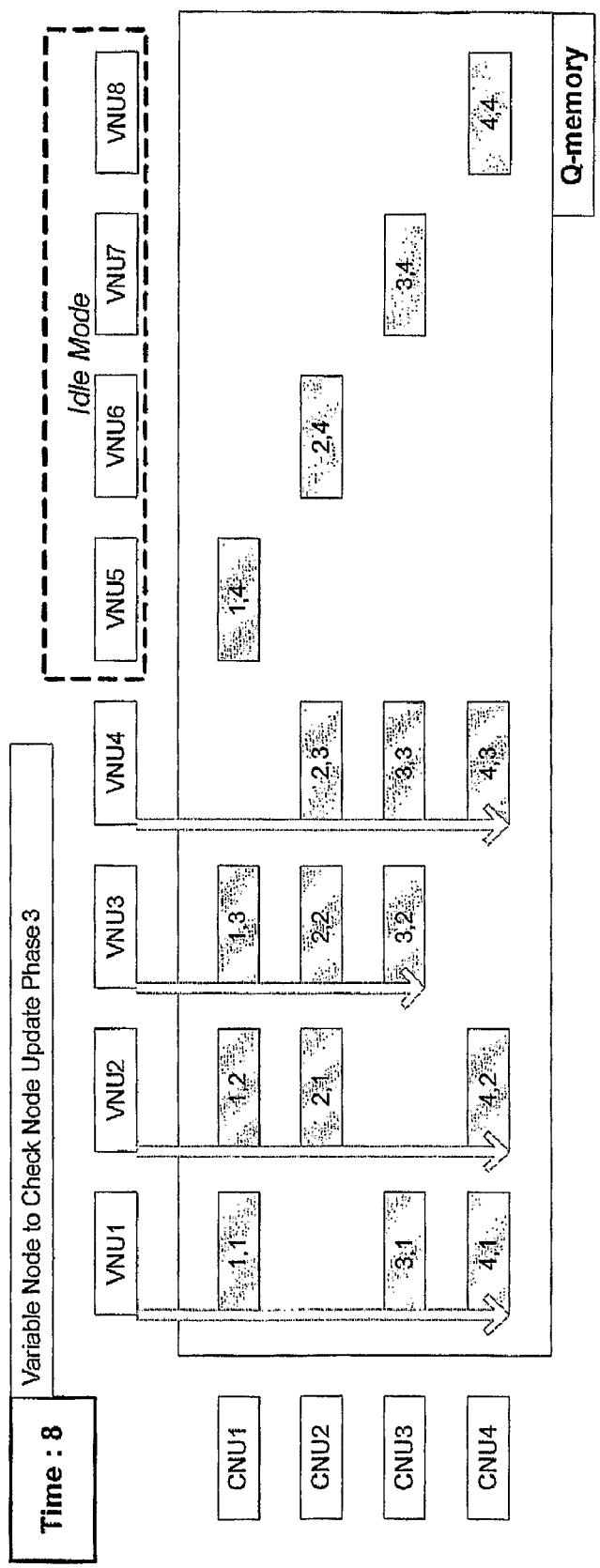

FIG. 12B to FIG. 12E illustrate probability value update from the check node to the variable node. The probability value update of the specific position is to update an element using the other elements in a specific row. FIG. 12F to FIG. 12H illustrate probability value update from the variable node to the check node. The probability value update of the specific position is to update an element using the other elements in a specific column.

After the steps of FIG. 12A to FIG. 12H are performed, a codeword is temporarily determined with reference to the Q-memory 1430, and it is identified whether the temporarily determined codeword (c') satisfies the check equation Hc'=0. If the codeword (c') does not satisfy the check equation, the steps of FIG. 12B to FIG. 12H are iterated. If iteration is performed as much as the predetermined number of times, or if a codeword which satisfies the check equation is obtained, the steps end.

Hereinafter, the operation of the LCPC decoder which processes the layered decoding, to which the parallel processing is applied, in parallel will be described.

In accordance with the embodiment of the present invention, the CNU 1110 and the VNU 1310 of the LDPC decoder 1000 update the probability value through processing steps of Equation 4 below. The Equation 4 is used for one iteration decoding.

For all $m$ in subset $k$ of the rows: [Equation 4]

$$L(q_{mj}) = L(q_j) - R_{mf}$$

$$A_{mf} = \sum_{\substack{n \in N(m) \\ n \neq j}} \Psi(L(q_{mn}))$$

$$S_{mf} = \prod_{\substack{m \in N(m) \\ n \neq J}} \text{Sign}(L(q_{mn}))$$

$$R_{mj} = -S_{mj}\Psi(A_{mj})$$

$$L(q_j) = L(q_{mj}) + R_{mj}$$

Variables used in the Equation 4 are as follows.

$$\psi(x) \equiv \log\left(\left|\tanh\left(\frac{x}{2}\right)\right|\right)$$

$L(q_{mj})$: Log Likelihood Ratio value connected from the mth variable node to the jth check node $L(q_j)$: Posterior LLR value of the jth variable node $R_{mj}$: LLR value connected from the jth check node to the mth variable node $A_{mj}$: dummy variable for calculating LLR value connected from the jth check node to the mth variable node $S_{mj}$: dummy variable for calculating symbols of LLR values connected from the jth check node to the mth variable node m: check node Index of Parity check matrix j: Variable node index of Parity check matrix The following Equation 5 illustrates an example of a log likelihood ratio (LLR) of the received signal. The following Equation 6 illustrates an example of a parity check matrix used in the decoder 1000 according to the embodiment of the present invention.

$$LLR = \begin{bmatrix} 10.54 \\ 8.85 \\ 4.43 \\ 3.76 \\ 9.0 \\ 11.37 \\ 6.86 \\ 8.34 \\ 7.75 \\ 4.43 \\ 8.99 \\ 8.02 \\ 5.21 \\ 10.45 \\ 5.3 \\ 7.03 \\ 8.54 \\ 9.67 \\ 9.08 \\ 7.32 \\ 8.23 \\ 3.93 \\ 6.67 \\ 10.31 \end{bmatrix}$$ [Equation 5]

$$\begin{matrix} \text{Layer0} \\ \text{Layer3} \\ \text{Layer6} \\ \text{Layer1} \\ \text{Layer4} \\ \text{Layer7} \\ \text{Layer2} \\ \text{Layer5} \end{matrix} \begin{bmatrix} 1 & 0 & 1 & 0 & 1 & 0 & 1 & 0 & 1 & 0 & 1 & 0 & 1 & 0 & 1 & 1 & 0 & 0 & 0 & 0 & 0 & 0 \\ 0 & 1 & 0 & 1 & 0 & 1 & 0 & 1 & 0 & 1 & 0 & 1 & 0 & 1 & 0 & 0 & 0 & 1 & 1 & 0 & 0 & 0 \\ 1 & 0 & 1 & 0 & 1 & 0 & 1 & 0 & 1 & 0 & 1 & 0 & 1 & 0 & 1 & 0 & 0 & 0 & 0 & 0 & 1 & 1 \\ 0 & 1 & 0 & 1 & 0 & 1 & 0 & 1 & 0 & 1 & 0 & 1 & 0 & 1 & 0 & 1 & 1 & 0 & 0 & 0 & 0 & 0 \\ 1 & 0 & 1 & 0 & 1 & 0 & 1 & 0 & 1 & 0 & 1 & 0 & 1 & 0 & 0 & 0 & 0 & 0 & 1 & 1 & 0 & 0 \\ 0 & 1 & 0 & 1 & 0 & 1 & 0 & 1 & 0 & 1 & 0 & 1 & 0 & 1 & 1 & 0 & 0 & 0 & 0 & 0 & 0 & 1 \\ 1 & 0 & 1 & 0 & 1 & 0 & 1 & 0 & 1 & 0 & 1 & 0 & 1 & 0 & 0 & 0 & 1 & 1 & 0 & 0 & 0 & 0 \\ 0 & 1 & 0 & 1 & 0 & 1 & 0 & 1 & 0 & 1 & 0 & 1 & 0 & 1 & 0 & 0 & 0 & 0 & 0 & 1 & 1 & 0 \end{bmatrix}$$ [Equation 6]

The matrix of the Equation 6 is an example of the parity check matrix used in the decoder 1000 according to the embodiment of the present invention. In the above matrix, one row of the parity check matrix represents one layer. Each layer in the above Equation 6 is not overlapped with its adjacent layer. The number of CNUs 1110 and VNUs 1310 of the decoder 1000 are preferably defined in accordance with the structure of the parity check matrix. Also, since layers not overlapped with each other are processed in parallel, it is more preferable that the number of CNUs 1110 is the number of rows included in the layers processed in parallel. More preferably, the number of VNUs 1310 is the number of columns of the parity check matrix. Accordingly, it is preferable that the number of CNUs 1110 of the decoder which uses the Equation 6 is two and the number of VNUs 1310 is twenty-four.

FIG. 13A to FIG. 13H are block diagrams illustrating a procedure of performing one iteration decoding when LDPC decoding is performed in accordance with one embodiment of the present invention. In FIG. 13A to FIG. 13I, Q and R represent states of memories which store values $q_{mj}$, $R_{mj}$ of the Equation 4, and '###' represents a random value which is not defined as a specific value. The Q-memory 1430 and the R-memory 1410 of FIG. 13A to FIG. 13I can store only processing values corresponding to the positions of the non-zero elements as illustrate in FIG. 10.

FIG. 13A illustrates an initialization step of LDPC decoding according to one embodiment of the present invention. The probability value (for example, LLR value) received from a channel is stored in the received LLR memory 1420, and the received probability value is input to the Q-memory 1430 in accordance with position information of weight of the parity check matrix stored in the parity check matrix index memory 1240. FIG. 13A illustrates the probability value input to the Q-memory through the initialization step.

FIG. 13B illustrates a probability value update step from the check node to the variable node with respect to Layer 0 and Layer 3 of the parity check matrix. The CNU 1110 perfotllis a processing step for updating the probability value from the check node to the variable node with respect to Layer 0 and Layer 3 of the parity check matrix. As described above, since two CNUs 1110 are operated, the two CNUs 1110 perform the check node update step for the Layer 0 and Layer 3. The processing result is stored in the R-memory 1410.

FIG. 13C illustrates a probability value update step from the variable node to the check node with respect to Layer 0 and Layer 3 of the parity check matrix H. Unlike the LDPC decoding according to the related art, the probability value update step from the variable node to the check node includes updating the probability value of the current layer using the probability value of the layer already updated during the same iteration step. Since the Layer 0 and the Layer 3 are not overlapped with each other, the problems of memory collision according to parallel processing and dependence between data processed in parallel do not occur. Accordingly, the probability value update step from the variable node to the check node with respect to the Layer 0 and the probability value update step from the check node to the variable node with respect to the Layer 3 can be processed in parallel. As described above, the decoder performs processing steps of the Layer 0 and the Layer 3 using the twenty-four VNUs 1310. FIG. 13C illustrates the result of the probability value update from the variable node to the check node with respect to Layer 0 and Layer 3 and the result of the probability value input for updating the probability value from the check node to the variable node with respect to Layer 6 and Layer 1.

FIG. 13D illustrates a probability value update step from a check node to a variable node with respect to Layer 6 and Layer 1 of the parity check matrix, FIG. 13E illustrates a probability value update step from a variable node to a check node with respect to Layer 6 and Layer 1 of the parity check matrix, FIG. 13F illustrates a probability value update step from a check node to a variable node with respect to Layer 4 and Layer 7 of the parity check matrix, FIG. 13G illustrates a probability value update step from a variable node to a check node with respect to Layer 4 and Layer 7 of the parity check matrix, FIG. 13H illustrates a probability value update step from a check node to a variable node with respect to Layer 2 and Layer 5 of the parity check matrix, and FIG. 13I illustrates a probability value update step from a variable node to a check node with respect to Layer 2 and Layer 5 of the parity check matrix. The value stored in the Q-memory 1430 is a processing value obtained through one iteration. The hard decision unit 1250 temporarily decides a codeword (c') with reference to the Q-memory 1430 after performing the steps of FIG. 13A to FIG. 13I, and identifies whether the codeword (c') satisfies the check equation Hc'=0. If the codeword(c') does not satisfy the check equation, the decoder iterates the steps of FIG. 13B to FIG. 13I. If iteration is performed as much as the maximum number of times, or if a codeword which satisfies the check equation is obtained, the steps end, and the codeword (c') is output to the outside.

The decoding method illustrated in FIG. 13 is different from that of FIG. 12 as follows. In the decoding method illustrated in FIG. 12, the check node update step and the variable node update step of one time are performed using the maximum number of CNUs and VNUs in accordance with the size of the parity check matrix. However, in the decoding method illustrated in FIG. 13, there are provided the CNUs, which are equivalent to the number of layers having no data dependence, i.e., the number of layers not overlapped with one another in the parity check matrix. And, the check node update step can be processed in parallel in accordance with the number of layers having no data dependence.

Furthermore, in the decoding method illustrated in FIG. 12, all regions of the Q-memory 1430 are initialized using the probability value for the received signal. On the other hand, in the decoding method illustrated in FIG. 13, layers that can simultaneously be processed in parallel are initialized, and the result value of the layers is used as an initialization value of next layer.

It will be apparent to those skilled in the art that the present invention can be embodied in other specific foul's without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

The invention claimed is:

1. A method of performing decoding an encoded codeword using a parity check matrix, the method comprising:
    decoding the codeword using the parity check matrix,
    wherein the parity check matrix is expanded from a model matrix, of which each element is '−1' expressing by a z-by-z zero matrix or a 'non-negative integer' expressing by a z-by-z permutation matrix generated by shifting each row or column of a z-by-z identity matrix as much as the 'non-negative integer,' by replacing each element of the model matrix with a z-by-z matrix indicated by a corresponding element,
    wherein the model matrix is generated from a base model matrix by splitting at least a row of the base model matrix exclusively into a plurality of rows such that at most one 'non-negative integer' element exists on the plurality of split rows in a column direction and by adding a same number of columns as an increased number of rows by splitting the row of the base model matrix to a parity part of the base model matrix,
    wherein at least two layers of the parity check matrix, respectively expanded from at least two rows of the model matrix, are simultaneously processed in parallel for decoding the codeword, and
    wherein the at least two rows, from which the at least two layers simultaneously processed in parallel are expanded, have at most one 'non-negative integer' element in each column of the model matrix.

2. The method of claim 1, further comprising:
    scheduling a decoding processor for each layer to process each row included in each of the at least two layers in parallel.

3. The method of claim 1, wherein the row of the base model matrix is split into at least two rows such that odd-numbered 'non-negative integer' elements on the row of the base model matrix are located in one of the two split rows in corresponding columns, even-numbered 'non-negative integer' elements on the row of the base model matrix are located in the other row of the two split rows in corresponding columns, and '−1' elements on the row of the base model matrix are located in each of the two split rows in corresponding columns.

4. An apparatus for performing decoding an encoded codeword using a parity check matrix, the method comprising:
    a decoder decoding the codeword using the parity check matrix,
    wherein the parity check matrix is expanded from a model matrix, of which each element is '−1' expressing a z-by-z zero matrix or a 'non-negative integer' expressing a z-by-z permutation matrix generated by shifting each row or column of a z-by-z identity matrix as much as the 'non-negative integer,' by replacing each element of the model matrix with a z-by-z matrix indicated by a corresponding element,
    wherein the model matrix is generated from a base model matrix by splitting at least a row of the base model matrix exclusively into a plurality of rows such that at most one 'non-negative integer' element exists on the plurality of split rows in a column direction and by adding a same number of columns as an increased number of rows by splitting the row of the base model matrix to a parity part of the base model matrix,
    wherein at least two layers of the parity check matrix, respectively expanded from at least two rows of the model matrix, are simultaneously processed in parallel for decoding the codeword, and
    wherein the at least two rows, from which the at least two layers simultaneously processed in parallel are expanded, have at most one 'non-negative integer' element in each column of the model matrix.

5. The apparatus of claim 4, further comprising means for scheduling a decoding processor for each layer to process each row included in each of the at least two layers in parallel.

6. The apparatus of claim 4, wherein the row of the base model matrix is split into at least two rows such that odd-numbered 'non-negative integer' elements on the row of the base model matrix are located in one of the two split rows in corresponding columns, even-numbered 'non-negative integer' elements on the row of the base model matrix are located in the other row of the two split rows in corresponding columns, and '−1' elements on the row of the base model matrix are located in each of the two split rows in corresponding columns.

* * * * *